United States Patent
Naito et al.

(10) Patent No.: US 6,606,237 B1
(45) Date of Patent: Aug. 12, 2003

(54) MULTILAYER CAPACITOR, WIRING BOARD, DECOUPLING CIRCUIT, AND HIGH FREQUENCY CIRCUIT INCORPORATING THE SAME

(75) Inventors: Yasuyuki Naito, Otsu (JP); Masaaki Taniguchi, Fukui-ken (JP); Yoichi Kuroda, Fukui (JP); Haruo Hori, Sabae (JP); David G. Figueroa, Mesa, AZ (US); Jorge P. Rodriguez, Portland, OR (US); Nicholas R. Watts, Phoenix, AZ (US); Nicholas L. Holmberg, Gilbert, AZ (US); Takashi Hioki, Tsukuba (JP)

(73) Assignees: Murata Manufacturing Co., Ltd., Kyoto (JP); Intel Corporation, Santa Clara, CA (US)

( * ) Notice: Subject to any disclaimer, the term of this patent is extended or adjusted under 35 U.S.C. 154(b) by 0 days.

(21) Appl. No.: 10/180,629

(22) Filed: Jun. 27, 2002

(51) Int. Cl.[7] ............... H01G 4/228; H01G 4/005
(52) U.S. Cl. ................ 361/306.3; 361/361; 361/303; 361/306.2
(58) Field of Search ............... 361/302, 303, 361/306.1, 306.2, 306.3, 308.1, 311, 312, 313, 321.2; 29/25.41, 25.42

(56) References Cited

U.S. PATENT DOCUMENTS

| 4,729,061 | A | | 3/1988 | Brown |
| 4,831,494 | A | * | 5/1989 | Arnold et al. ........... 361/306.3 |
| 5,874,770 | A | | 2/1999 | Saia et al. |
| 5,939,782 | A | | 8/1999 | Malladi |
| 6,034,864 | A | | 3/2000 | Naito et al. |
| 6,262,446 | B1 | | 7/2001 | Koo et al. |
| 6,327,134 | B1 | * | 12/2001 | Kuroda et al. ........... 361/303 |
| 6,344,961 | B1 | * | 2/2002 | Naito et al. ............. 361/302 |
| 6,346,743 | B1 | | 2/2002 | Figueroa et al. |
| 6,351,369 | B1 | | 2/2002 | Kuroda et al. |
| 6,370,010 | B1 | * | 4/2002 | Kuroda et al. ......... 361/306.1 |
| 6,370,011 | B1 | | 4/2002 | Naito et al. |
| 6,407,904 | B1 | | 6/2002 | Kuroda et al. |

OTHER PUBLICATIONS

U.S. patent application No. 09/751,612 filed on Dec. 29, 2002, by Figueroa et al.

* cited by examiner

Primary Examiner—Anthony Dinkins
(74) Attorney, Agent, or Firm—Keating & Bennett, LLP

(57) ABSTRACT

A multilayer capacitor is constructed to minimize equivalent series inductance (ESL) and to achieve large capacitance. The capacitor includes first and second main go surface terminal electrodes provided on a first main surface of the main body of the multilayer capacitor. First and second side surface terminal electrodes are disposed on four side surfaces of the main body. The main body is divided into a low ESL section of the first main-surface side and a high capacitance section of the second main-surface side. In the low ESL section, in addition to first and second low ESL internal electrodes, a first conductive via-hole electrically connecting the first low ESL internal electrode to the first main surface terminal electrode and a second conductive via-hole electrically connecting the second low ESL internal electrode to the second main surface terminal electrode are provided. In the high capacitance section, in addition to first and second high capacitance internal electrodes, a first leading electrode electrically connecting the first high capacitance internal electrode to the first side surface terminal electrode and a second leading electrode electrically connecting the second high capacitance internal electrode to the second side surface terminal electrode are provided.

43 Claims, 14 Drawing Sheets

A: VOLTAGE CURVE OF VERY-LOW ESL SECTION
B: VOLTAGE CURVE OF INTERMEDIATE ESL AND CAPACITANCE
C: VOLTAGE CURVE OF CAPACITANCE SECTION

MULTILAYER CAPACITOR, WIRING BOARD, DECOUPLING CIRCUIT, AND HIGH FREQUENCY CIRCUIT INCORPORATING THE SAME

BACKGROUND OF THE INVENTION

1. Field of the Invention

The present invention relates to multilayer capacitors, wiring boards, decoupling circuits, and high frequency circuits, which include the multilayer capacitors. More particularly, the present invention relates to multilayer capacitors that are very effective in high frequency circuits. In addition, the present invention relates to wiring boards, decoupling circuits, and high frequency circuits including the multilayer capacitors.

2. Description of the Related Art

Most conventional multilayer capacitors are formed of ceramic dielectric materials. In addition, each of these conventional multilayer capacitors has a main body including a plurality of laminated dielectric layers, and a plurality of pairs of first and second internal electrodes opposing each other via specified dielectric layers and alternately arranged in a direction in which the dielectric layers are laminated to form a plurality of capacitor units. First external terminal electrodes are located on the first end surface of the main body, and second external terminal electrodes are located on the second end surface thereof. The first internal electrodes are extended onto the first end surface of the main body to be electrically connected to the first external terminal electrodes. In addition, the second internal electrodes are extended onto the second end surface of the main body to be electrically connected to the second external terminal electrodes.

In the multilayer capacitor, for example, currents flow By from the second external terminal electrodes to the first external terminal electrodes. In this case, the currents flow from the second external terminal electrodes to the second internal electrodes and, then, flow from the second internal electrodes to the first internal electrodes passing through the dielectric layers. After this, the currents pass through the first internal electrodes to the first external terminal electrodes.

The equivalent circuit of a capacitor is shown as a circuit in which a capacitance (C), an equivalent series inductance (ESL), and the resistance (R) of an electrode are connected in series. In this case, R is referred to as an equivalent series resistance (ESR).

In the equivalent circuit, a resonant frequency $f_0$ is determined by an equation $f_0 = 1/[2\pi \times (L \times C)^{1/2}]$. The capacitor cannot function at a frequency higher than the resonant frequency. In other words, when the value of L, that is, the value of ESL is small, the resonant frequency $f_0$ becomes high, so that the capacitor can be used at the higher frequency. It is considered that copper may be used as the material of internal electrodes to reduce the value of ESR. However, in order to use the capacitor in a microwave band, the capacitor must be capable of reducing ESL.

In addition, the reduction of ESL is required for a capacitor used as a decoupling capacitor connected to a power source circuit for supplying a power source to a MPU chip of a micro processing unit (MPU) of a workstation, a personal computer, or other suitable device.

Regarding this case, FIG. 16 is a block diagram illustrating an example of a connecting structure including a MPU 1 and a power source unit 2.

In FIG. 16, the MPU 1 has a MPU chip 3 and a memory 4. The power source unit 2 supplies a power source to the MPU chip 3. A decoupling capacitor 5 is connected to a power source circuit located between the power source unit 2 and the MPU chip 3. In addition, a signal circuit is located between the MPU chip 3 and the memory 4.

The decoupling capacitor 5 used in the MPU 1, like a typical type of decoupling capacitor, is used to smooth noise absorption and fluctuations in the power source. Moreover, recently, the operational frequency of the MPU chip 3 has been designed to be over 1 GHz. Thus, the MPU chip 3 needs to have high-speed performance. In order to satisfy this requirement, a quick power supply function is necessary. This is a function in which power is supplied in a few nanoseconds from the capacity of electricity charged in a capacitor, when power for starting-up is suddenly needed.

Thus, an inductance component provided in the decoupling capacitor 5 used in the MPU 1 is required to be as low as possible, for example, to be a few pH or lower. That is, a capacitor having lower inductance is desired.

More specifically, in the MPU chip 3, a DC current voltage of approximately 2.0V is applied, and a consumed power is approximately 24W. That is, a current of approximately 12A flows through the chip. In this case, there is provided an arrangement for reducing the consumption of power. When the MPU 1 is not operating, the MPU 1 is in a sleep mode, in which the amount of the consumed power is reduced to 1W or lower. When converted from the sleep mode to an active mode, it is necessary to supply power required for the active mode to the MPU chip 3 in a significantly short time, as shown below. At the operational frequency of 1 GHz, when converted from the sleep mode to the active mode, power needs to be supplied in 2 to 4 nanoseconds.

However, since the power source unit 2 cannot supply the power in such a short time, electrical charge accumulated in the decoupling capacitor 5 near the MPU chip 3 is released until the power source is supplied from the power source unit 2 to the MPU chip 3.

In the case of an MPU having an operational clock frequency exceeding 1 GHz, in order to perform the above function, the ESL of the decoupling capacitor 5 disposed near the MPU chip 3 needs to be a few pH or lower.

However, since the ESL of the above-mentioned conventional multilayer capacitor ranges from approximately 500 pH to 800 pH, this hardly satisfies the above necessary condition of being a few pH or lower. Regarding an inductance component occurring in the multilayer capacitor, magnetic flux, having a direction that is determined by the direction of a current flowing though the multilayer capacitor, is induced to produce a self-inductance component.

Under the aforementioned background, examples of the structures of multilayer capacitors capable of reducing .ESL are provided in Japanese Unexamined Patent Application Publication No. 2-256216, U.S. Pat. No. 5,880,925, Japanese Unexamined Patent Application Publication No. 2-159008, Japanese Unexamined Patent Application Publication No. 11-144996, and Japanese Unexamined Patent Application Publication No. 7-201651.

The ESL is reduced by cancellation of magnetic flux induced in the multilayer capacitor. For the cancellation of magnetic flux, the direction of a current flowing through the multilayer capacitor is diversified. In order to diversify the direction of the current, the number of terminal electrodes provided on the external surface of the main body of the capacitor is increased, thereby increasing the number of leading internal electrodes extended to be electrically connected to the terminal electrodes. Additionally, the leading internal electrodes are oriented in some directions.

For example, in each of Japanese Unexamined Patent Application Publication No. 2-256216, U.S. Pat. No. 5,880,925, and Japanese Unexamined Patent Application Publication No. 2-159008, there is provided a structure in which lead internal electrodes are extended onto two opposing side surfaces of the main body of a multilayer capacitor, which is a first conventional art.

In addition, Japanese Unexamined Patent Application Publication No. 11-144996 provides a structure in which leading internal electrodes are extended onto four side surfaces of the main body of a multilayer capacitor, which is a second conventional art.

Furthermore, Japanese Unexamined Patent Application Publication No. 7-201651 provides a structure in which leading internal electrodes are extended onto a main surface of the main body of a multilayer capacitor, which is a third conventional art.

When a focus is put on the reduction of ESL in the first to third conventional arts, in general, the second conventional art can achieve an ESL that is lower than the first conventional art. Moreover, the third conventional art can achieve an ESL that is lower than the second conventional art. In other words, in terms of the reduction of ESL, the third conventional art is the most effective.

However, the third conventional art has a problem in that it is difficult to obtain large capacitance when the ESL is reduced. This problem will be explained below.

In the multilayer capacitor of the third conventional art, conductive via-holes are formed in order to lead internal electrodes onto the main surface of the main body of the multilayer capacitor. First and second internal electrodes opposing each other via dielectric layers are both led out onto one of the main surfaces of the capacitor unit so that capacitor units are produced. In this situation, even though only one pair of first and second internal electrodes is provided, a conductive via-hole connected to one of the first and second internal electrodes needs to be extended in such a manner that the conductive via-hole passes through the other internal electrode. Thus, since the other internal electrode needs to be insulated from the conductive via-hole, a gap must be formed around the part of the other internal electrode, through which the conductive via-hole passes.

Furthermore, in order to obtain larger capacitance in the multilayer capacitor, a plurality of first and second internal electrodes are alternately arranged in a direction in which dielectric layers are laminated to define a plurality of capacitor units, which are connected in parallel via conductive via-holes.

Thus, a first conductive via-hole connected to the first internal electrodes is extended in a manner that the first conductive via-hole electrically connects the plurality of first internal electrodes to each other while passing through the second internal electrodes. In addition, a second conductive via-hole connected to the second internal electrodes is extended in a manner that the second conductive via-hole electrically connects the plurality of second internal electrodes to each other while passing through the first internal electrodes.

Thus, in each of the second internal electrodes, it is necessary to form a gap around a part where the first conductive via-hole passes through, by which the first conductive via-hole and the second internal electrodes need to be insulated from each other. Similarly, in each of the first internal electrodes, it is necessary to form a gap around a part where the second conductive via-hole passes through, by which the second conductive via-hole and the first internal electrodes need to be insulated from each other.

However, since the above gap formation leads to reduction of the areas of the internal electrodes, large capacitance cannot be obtained. In addition, in the multilayer capacitor according to the third conventional art, in order to reduce the ESL even more, it is necessary to narrow the gaps between the plurality of conductive via-holes while increasing the number of the conductive via-holes. As a result, this arrangement causes a serious problem in that the areas of the internal electrodes are reduced due to the further reduction of ESL, and large capacitance cannot thereby be obtained due to the reduction of the areas of the internal electrodes.

As described above, in the third conventional art, it is difficult to satisfy both demands of reducing the ESL and obtaining large capacitance. That is, the third conventional art cannot satisfactorily meet the demand for capacitance that is large enough to provide a large amount of power required by the high-speed operation of the MPU.

Examples of the structures of multilayer capacitors capable of increasing capacitance are provided in U.S. patent application Ser. No. 09/751,612, filed on Dec. 29, 2000, entitled "Multiple Tier Array Capacitor and Methods of Fabrication Therefor," which is incorporated herein by reference.

The multilayer capacitor embodiments described in that application include multiple "tiers" of capacitance. Similar to the third conventional art described above, via-holes are formed in order to lead internal electrodes onto the top and/or bottom main surfaces of the capacitor. However, each "tier" includes a different number of via holes that lead the tiers' layers to the surfaces. For example, one tier has a relatively large number of via holes, resulting in a relatively low ESL. However, the many gaps in the conductive layers also result in a relatively low capacitance. Other tiers, have smaller numbers of via holes, resulting in fewer gaps and relatively larger capacitance. However, the fewer via holes also result in a relatively higher ESL than the first tier. Accordingly, the ESL and capacitance of each tier varies. Although this solution satisfies both demands of reducing the ESL and obtaining large capacitance, further reductions in ESL are desirable as the power required by the high-speed operation of the MPU continues to increase.

SUMMARY OF THE INVENTION

In order to overcome the problems described above, preferred embodiments of the present invention provide a multilayer capacitor that minimizes ESL and achieves a very large capacitance.

In addition, preferred embodiments of the present invention overcome the problems described above by providing a multilayer capacitor that greatly increases capacitance, minimizes inductance, while reducing the cost and difficulty of manufacturing such a novel multilayer capacitor.

In addition, in order to overcome the problems described above, preferred embodiments of the present invention provide a method of fabricating a capacitor, a wiring board, a decoupling circuit, and a high frequency circuit incorporating the unique multilayer capacitor described in the preceding paragraph.

According to a first preferred embodiment of the present invention, a multilayer capacitor includes a main body having a first main surface and a second main surface opposing each other, at least one side surface connecting the first and second main surfaces, and a plurality of laminated dielectric layers. A first main surface terminal electrode and a second main surface terminal electrode are provided on the first main surface of the main body. A first side surface terminal electrode and a second side surface terminal electrode are disposed on at least the side surface of the main body. The main body is divided into a low ESL section on the first main-surface side and a high capacitance section on the second main-surface side.

The low ESL section includes a first low ESL internal electrode and a second low ESL internal electrode opposing each other via a specified dielectric layer, a first conductive via-hole electrically connecting the first low ESL internal electrode to the first main surface terminal electrode and a second conductive via-hole electrically connecting the second low ESL internal electrode to the second main surface terminal electrode.

The high capacitance section includes a first high capacitance internal electrode and a second high capacitance internal electrode opposing each other via a specified dielectric layer, and a first leading electrode electrically connecting the first high capacitance internal electrode to the first side surface terminal electrode and a second leading electrode electrically connecting the second high capacitance internal electrode to the second side surface terminal electrode.

Preferably, in the multilayer capacitor according to various preferred embodiments of the present invention, a plurality of pairs of the first and second main surface terminal electrodes, and the first main surface terminal electrodes and the second main surface terminal electrodes are adjacent to each other.

In addition, preferably, when a plurality of pairs of the first and second side surface terminal electrodes is provided, the first side surface terminal electrodes and the second side surface terminal electrodes are adjacent to each other.

Furthermore, preferably, the main body of the multilayer capacitor has four side surfaces, on each of which the first and second side surface terminal electrodes are disposed. In this case, preferably, the first and second side surface terminal electrodes are adjacent to each other via the four side surfaces of the main body.

In the multilayer capacitor according to various preferred embodiments of the present invention, preferably, the first and second side surface terminal electrodes are arranged in a direction in which the first and second main surface terminal electrodes are arranged, the second side surface terminal electrodes are adjacent to the first main surface terminal electrodes, and the first side surface terminal electrodes are adjacent to the second main surface terminal electrodes.

In addition, the length of the first conductive via-hole may differ from the length of the second conductive via-hole.

In addition, the first conductive via-hole may be formed in the periphery of the first low ESL internal electrode and the second conductive via-hole may be formed in the periphery of the second low ESL internal electrode.

In addition, the multilayer capacitor of various preferred embodiments of the present invention may further include a third leading electrode electrically connecting the first low ESL internal electrode to the first side surface terminal electrode and a fourth leading electrode electrically connecting the second low ESL internal electrode to the second side surface terminal electrode.

Preferably, in this case, the first low ESL internal electrode and the first high capacitance internal electrode are electrically connected to the same first side surface terminal electrode, and the second low ESL internal electrode and the second high capacitance internal electrode are electrically connected to the same second side surface terminal electrode.

In the above-described multilayer capacitor, a current capacitance that the multilayer capacitor can provide is determined by the cross-sectional areas of the side surface terminal electrodes. Therefore, preferably, the total cross-sectional area of the first and second side surface terminal electrodes is larger than the total cross-sectional area of the first and second conductive via-holes. More specifically, it is preferable that the total cross-sectional area of the first and second side surface terminal electrodes is substantially equal to or more than approximately $5.0 \times 10^{-4}$ mm$^2$, and more preferably, it is substantially equal to or more than approximately $1.0 \times 10^{-2}$ mm$^2$.

In addition, the multilayer capacitor of various preferred embodiments of the present invention may further include a third conductive via-hole electrically connecting at least one of the first low ESL internal electrode and the second low ESL internal electrode to at least one of the first high capacitance internal electrode and the second high capacitance internal electrode.

Furthermore, the multilayer capacitor of various preferred embodiments of the present invention may further include a third leading electrode electrically connecting the first low ESL internal electrode to the first side surface terminal electrode, a fourth leading electrode electrically connecting the second low ESL internal electrode to the second side surface terminal electrode, and a third conductive via-hole electrically connecting at least one of the first low ESL internal electrode and the second low ESL internal electrode to at least one of the first high capacitance internal electrode and the second high capacitance internal electrode. In this multilayer capacitor, the first low ESL internal electrode and the first high capacitance internal electrode are electrically connected to the same first side surface terminal electrode, and the second low ESL internal electrode and the second high capacitance internal electrode are electrically connected to the same second side surface terminal electrode.

In this case, a current capacitance that the multilayer capacitor can provide is determined by the total cross-sectional area of the first and second side surface terminal electrodes and the third conductive via-hole. Thus, preferably, the total cross-sectional area of the first and second side surface terminal electrodes and the third conductive via-hole is substantially equal to or more than approximately $5.0 \times 10^{-4}$ mm$^2$, and more preferably, it is substantially equal to or more than approximately $1.0 \times 10^{-2}$ mm$^2$.

In addition, preferably, the first and second side surface terminal electrodes have portions that extend to at least one of the first and second main surfaces of the main body.

When the first and second side surface terminal electrodes have portions extending to the first main surface of the main body, preferably, the first and second main surface terminal electrodes and the first and second side surface terminal electrodes have lengths that are substantially equal to or more than $1.0 \times 10^{-2}$ mm on the first main surface of the main body.

When the first and second side surface terminal electrodes having portions extending to both the first and second main surfaces of the main body, preferably, the first and second main surface terminal electrodes have lengths that are substantially equal to or more than approximately $1.0 \times 10^{-2}$ mm on the first main surface of the main body, and the first and second side surface terminal electrodes have lengths that are substantially equal to or more than approximately $1.0 \times 10^{-2}$ mm on the first and second main surfaces of the main body.

Furthermore, preferably, the first low ESL internal electrode and the first high capacitance internal electrode have substantially the same outer configuration, and the second low ESL internal electrode and the second high capacitance internal electrode have substantially the same outer configuration.

Furthermore, the multilayer capacitor of various preferred embodiments of the present invention may be used as a decoupling capacitor connected to a power source circuit used for a MPU chip incorporated in a micro-processing unit.

According to yet another preferred embodiment of the present invention, there is provided a wiring board incorporating the multilayer capacitor described above or containing the same therein.

The wiring board of other preferred embodiments of the present invention includes a MPU chip disposed in a microprocessing unit, a power source conductive wire for supplying a power source used for the MPU chip, and a ground-side conductive wire. In this wiring board, one of the first main surface terminal electrode and the second main surface terminal electrode of the multilayer capacitor, and one of the first side surface terminal electrode and the second side surface terminal electrode thereof are electrically connected to the power source conductive wire, and the remaining main surface terminal electrode and the remaining side surface terminal electrode are electrically connected to the ground-side conductive wire.

Preferably, the multilayer capacitor incorporating the above-described wiring board is arranged in such a manner that the first main surface of the main body thereof faces toward the MPU chip.

According to another preferred embodiment of the present invention, a decoupling circuit includes the multilayer capacitor according to the other preferred embodiments of the present invention.

Furthermore, according to yet another preferred embodiment of the present invention, a high frequency circuit includes the multilayer capacitor according to the other preferred embodiments of the present invention.

According to another preferred embodiment of the present invention, a capacitor includes a first tier of capacitance, which includes multiple first layers of patterned conductive material separated by layers of dielectric material. A first number of first capacitor vias extend from a top surface of the capacitor through the multiple first layers, where some of the first capacitor vias make electrical contact with every other one of the multiple first layers, and others of the first capacitor vias make electrical contact with a remainder of the multiple first layers. The capacitor also includes a second tier of capacitance, electrically connected to the first tier of capacitance, which includes multiple second layers of patterned conductive material. A second number of second capacitor vias extend through the multiple second layers, where some of the second capacitor vias make electrical contact with every other one of the multiple second layers, and others of the second capacitor vias make electrical contact with a remainder of the multiple second layers. The capacitor also includes a first side surface terminal electrode and a second side surface terminal electrode disposed on at least one side surface of the capacitor, where the first side surface terminal electrode makes electrical contact with some of the multiple first layers and multiple second layers, and the second side surface terminal electrode makes electrical contact with others of the multiple first layers and multiple second layers.

According to another preferred embodiment of the present invention, a method for fabricating a capacitor includes fabricating a multi-layer structure, which includes a first tier of capacitance and a second tier of capacitance electrically connected to the first tier of capacitance. The first tier has multiple first layers of patterned conductive material separated by layers of dielectric material, and the second tier has multiple second layers of patterned conductive material. The method also includes forming a first number of first capacitor vias, which extend from a top surface of the capacitor through the multiple first layers, where some of the first capacitor vias make electrical contact with every other one of the multiple first layers, and others of the first capacitor vias make electrical contact with a remainder of the multiple first layers. The method also includes forming a first side surface terminal electrode and a second side surface terminal electrode disposed on at least one side surface of the capacitor, where the first side surface terminal electrode makes electrical contact with some of the multiple first layers and multiple second layers, and the second side surface terminal electrode makes electrical contact with others of the multiple first layers and multiple second layers.

Additional features, elements, characteristics and advantages of the present invention will become more apparent from the following detailed description of preferred embodiments thereof with reference to the attached drawings.

BRIEF DESCRIPTION OF THE DRAWINGS

FIGS. 3A and 3B show plan views of the internal structure of a low ESL section of the multilayer capacitor shown in FIG. 2, in which FIG. 3A shows a cross section through which a first low ESL internal electrode passes, and FIG. 3B shows a cross section through which a second low ESL internal electrode passes;

FIGS. 4A and 4B show plan views of the internal structure of a high capacitance section of the multilayer capacitor shown in FIG. 2, in which FIG. 4A shows a cross section through which a first high capacitance internal electrode passes, and FIG. 4B shows a cross section through which a second high capacitance internal electrode passes;

DETAILED DESCRIPTION OF PREFERRED EMBODIMENTS

Figure 1:
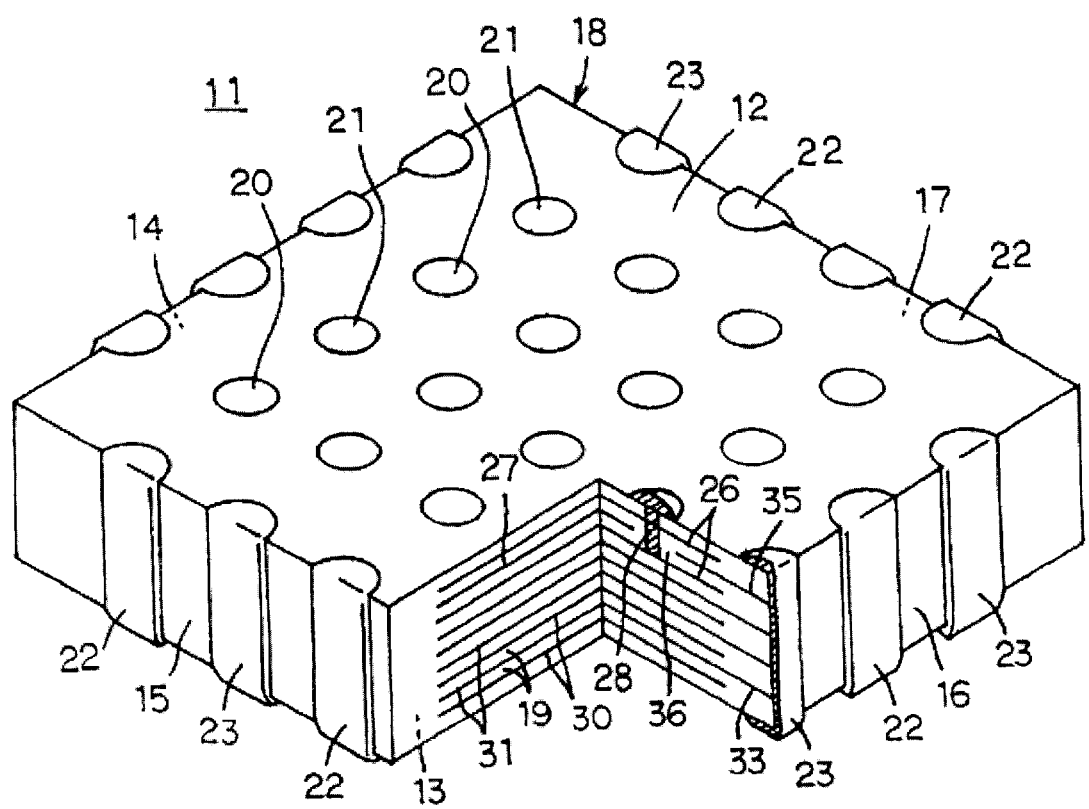
FIG. 1 shows a partially cut-away perspective view of an internal structure of a multilayer capacitor according to a preferred embodiment of the present invention.
Figure 2:
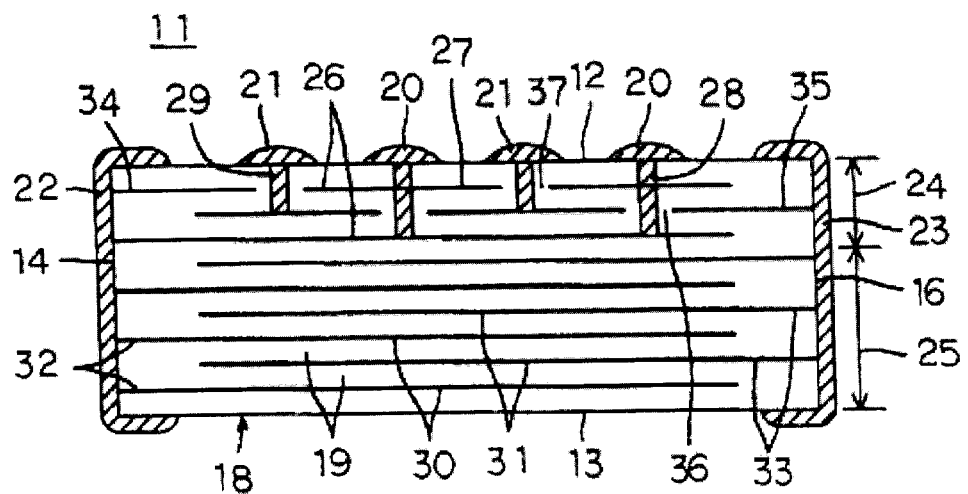
FIG. 2 shows a front view of the internal structure of the multilayer capacitor shown in FIG. 1.

FIG. 1 to FIG. 4B illustrate a multilayer capacitor 11 according to a preferred embodiment of the present invention. FIG. 1 shows a partially cut-away perspective view of the internal structure of the multilayer capacitor 11 while showing the appearance thereof. FIG. 2 shows a front view of the internal structure of the multilayer capacitor 11. Each of FIGS. 3A and 3B, and FIGS. 4A and 4B show plan views of the internal structure of the multilayer capacitor 11. These plan views show the views of different sections.

The multilayer capacitor 11 includes a substantially rectangular capacitor main body 18 having a first main surface 12 and a second main surface 13 opposing each other, and four side surfaces 14, 15, 16, and 17 connecting the first and second main surfaces 12 and 13. In this preferred embodiment, each of the main surfaces 12 and 13 preferably has a substantially square form. It should be noted that other shapes such as substantially rectangular or even substantially circular may be used with the capacitors according to preferred embodiments of the present invention.

The main body 18 of the multilayer capacitor includes, for example, a plurality of laminated dielectric layers 19 formed of a ceramic dielectric material and which extend in the directions of the main surfaces 12 and 13, respectively.

A plurality of pairs of first and second main surface terminal electrodes 20 and 21 are provided on the main surface 12 of the capacitor main body 18. The first and second main surface terminal electrodes 20 and 21 are adjacent to each other.

A plurality of pairs of first and second side surface terminal electrodes 22 and 23 are disposed on each of the four side surfaces 14 to 17 of the main body 18. The first and second side surface terminal electrodes 22 and 23 are adjacent to each other on each of the side surfaces 14 to 17. In addition, the first and second electrodes 22 and 23 on the different side surfaces are also adjacent to each other along the four side surfaces 14 to 17.

In this preferred embodiment, the first and second side-surface terminal electrodes 22 and 23 preferably have strip configurations extending to a portion of each of the main surfaces 12 and 13.

The main body 18, as shown in FIG. 2, is divided into a low ESL section 24 positioned on the side of the first main surface 12 and a high capacitance section 25 positioned on the side of the second main surface 13, according to the functions of sections.

In the low ESL section 24, a first low ESL internal electrode 26 and a second low ESL internal electrode 27 are arranged opposite to each other via a specific dielectric layer 19, and a first conductive via-hole 28 electrically connecting the first low ESL internal electrode 26 to the first main surface terminal electrode 20 and a second conductive via-hole 29 electrically connecting the second low ESL internal electrode 27 to the second main surface terminal electrode 21.

A first high capacitance internal electrode 30 and a second high capacitance internal electrode 31 are provided in the high capacitance section and oppose each other via a specific dielectric layer 19. The high capacitance section also includes a first leading electrode 32 electrically connecting the first high capacitance internal electrode 30 to the first side surface terminal electrode 22 and a second leading electrode 33 electrically connecting the second high capacitance internal electrode 31 to the second side surface terminal electrode 23.

Figure 3A:
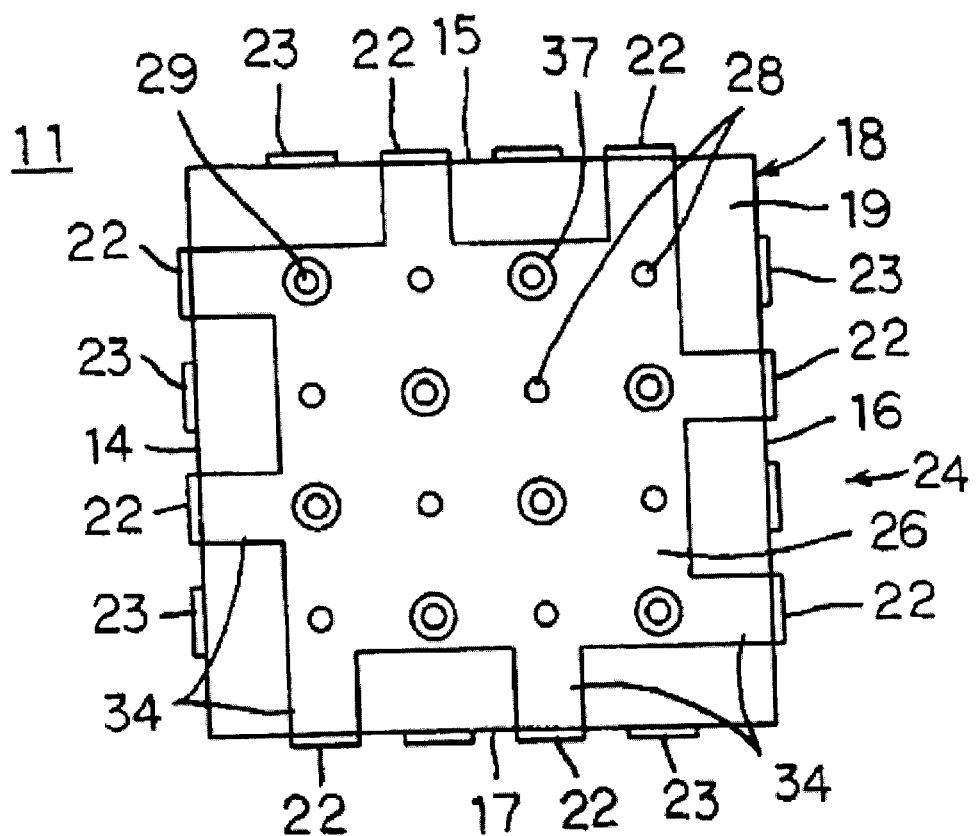
Figure 3B:
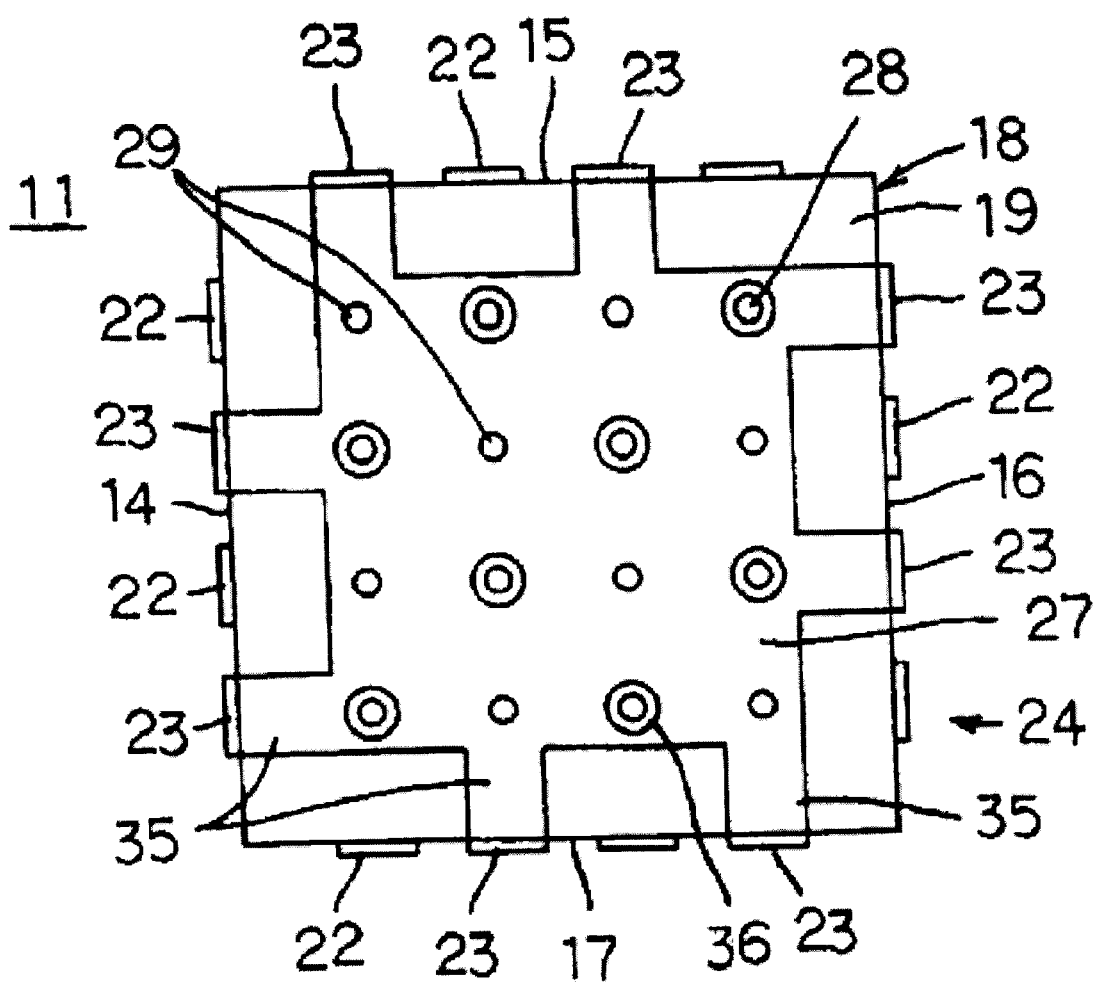
Figure 4A:
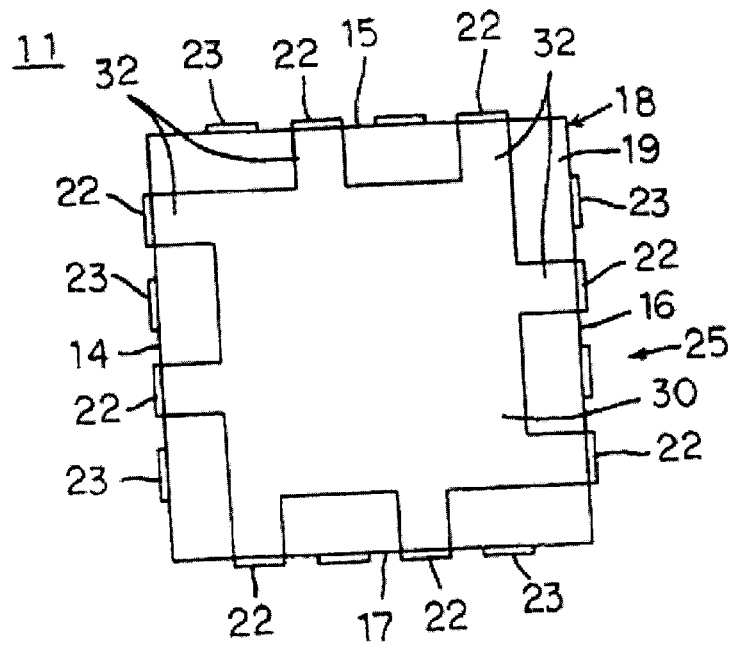
Figure 4B:
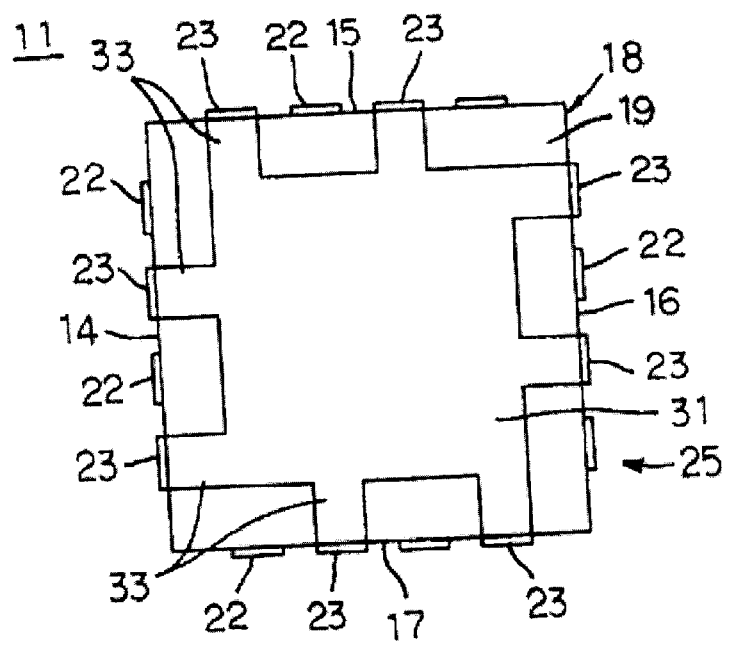

FIG. 3A shows a sectional surface on which the first low ESL internal electrode 26 is disposed, and FIG. 3B shows a sectional surface on which the second low ESL internal electrode 27 is disposed. In addition, FIG. 4A shows a sectional surface on which the first high capacitance internal electrode 30 is disposed, and FIG. 4B shows a sectional surface on which the second high capacitance internal electrode 31 is disposed.

As shown from the comparison of FIGS. 3A and 3B and FIGS. 4A and 4B, the first low ESL internal electrode 26 has substantially the same outer configuration as that of the first high capacitance internal electrode 30. In addition, a third leading electrode 34 electrically connecting the first low ESL internal electrode 26 to the first side surface terminal electrode 22 is disposed on the first low ESL internal electrode 26.

The second low ESL internal electrode 27 has substantially the same outer configuration as that of the second high capacitance internal electrode 31. In addition, a fourth leading electrode 35 electrically connecting the second low ESL internal electrode 27 to the second side surface terminal electrode 23 is disposed on the second low ESL internal electrode 27.

In this way, the first low ESL internal electrode 26 and the first high capacitance internal electrode 30 are electrically connected to the same first side surface terminal electrode 22. The second low ESL internal electrode 27 and the second high capacitance internal electrode 31 are electrically connected to the same second side surface terminal electrode 23.

The first low ESL internal electrode 26 and the second low ESL internal electrode 27 are alternately arranged in a direction in which the dielectric layers 19 are laminated. This arrangement defines a plurality of portions in which the first low ESL internal electrode 26 and the second low ESL internal electrode 27 are opposed to each other so as to define a plurality of capacitor units. The plurality of capacitor units are connected in parallel to each other by the first and second conductive via-holes 28 and 29.

More specifically, the first conductive via-hole 28 passes through the second low ESL internal electrode 27, which forms a gap 36 around the part where the first conductive via-hole 28 passes through. With this arrangement, the first conductive via-hole 28 is insulated from the second low ESL internal electrode 27.

The second conductive via-hole 29 passes through the first low ESL internal electrode 26, which forms a gap 37 around the part where the second conductive via-hole 29 passes through. With this arrangement, the second conductive via-hole 29 is insulated from the first low ESL internal electrode 26.

As shown in FIG. 2, when a plurality of the first low ESL internal electrodes 26 are provided, the first conductive via-hole 28 is extended in such a manner that the plurality of first low ESL internal electrodes 26 are electrically connected to each other. Similarly, unlike the arrangement shown in the figure, when a plurality of the second low ESL internal electrodes 27 are provided, the second conductive via-hole 29 is extended in such a manner that the plurality of the second low ESL internal electrodes 27 are electrically connected to each other.

In addition, as shown in FIG. 2, while being adjacent to the boundary between the low ESL section 24 and the high capacitance section 25, the first low ESL internal electrode 26 is positioned on the side of the low ESL section 24 (the position is hereinafter referred to as an "end") while being adjacent to the boundary. In this case, since it is not necessary for the second conductive via-hole 29 to penetrate the first low ESL internal electrode 26 at the end, the gap 37 does not have to be formed. Similarly, unlike the arrangement shown in the figure, when the second low ESL internal electrode 27 is positioned at the end of the low ESL section 24, it is unnecessary for the first conductive via-hole 28 to penetrate the second low ESL internal electrode 27 positioned at the end thereof. Thus, the gap 36 does not have to be formed.

As mentioned above, when the second conductive via-hole 29 or the first conductive via-hole 28 does not have to penetrate the first low ESL internal electrode 26 or the second low ESL internal electrode 27 at the end, the gap 37 or 36 does not have be formed. As a result, the area of the first low ESL internal electrode 26 or the area of the second low ESL internal electrode 27 can be increased, by which a very large capacitance can be obtained.

In the above case, the length of the first conductive via-hole 28 is different from the length of the second conductive via-hole 29.

As shown in FIGS. 4A and 4B, no gap needs to be formed between each of the first and second high capacitance internal electrodes 30 and 31 and each of the second and first conductive via-holes, which are electrically insulated from the first and second high capacitance internal electrodes 30 and 31. Thus, the total area of the first and second high capacitance internal electrodes 30 and 31 can be used for obtaining capacitance.

In the low ESL section 24 of the multilayer capacitor 11 having the above-described structure, both in the proximity of the side surfaces 14 to 17 of the main body 18 and at the approximate center of the main surface 12, currents flow in various directions. As a result, magnetic fluxes generated by the currents flowing in the various directions are effectively cancelled. Thus, the generation of magnetic fluxes can be minimized and the current lengths can be shortened. Consequently, the ESL of the multilayer capacitor 11 is minimized.

In the high capacitance section 25, since a gap that is used for electrical insulation from each of the conductive via-holes is not formed, the areas of the high capacitance internal electrodes 30 and 31 can be used for obtaining capacitance. As a result, the multilayer capacitor 11 can achieve a very large capacitance.

Figure 5:
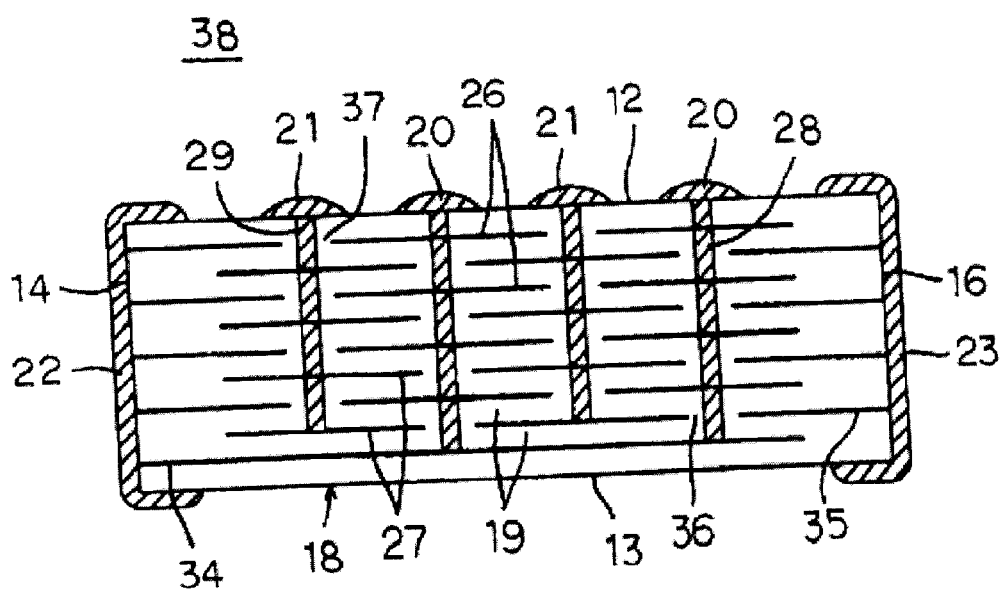
FIG. 5 shows a multilayer capacitor as example 1 for comparison, in which the view is equivalent to the view of FIG. 2.
Figure 6:
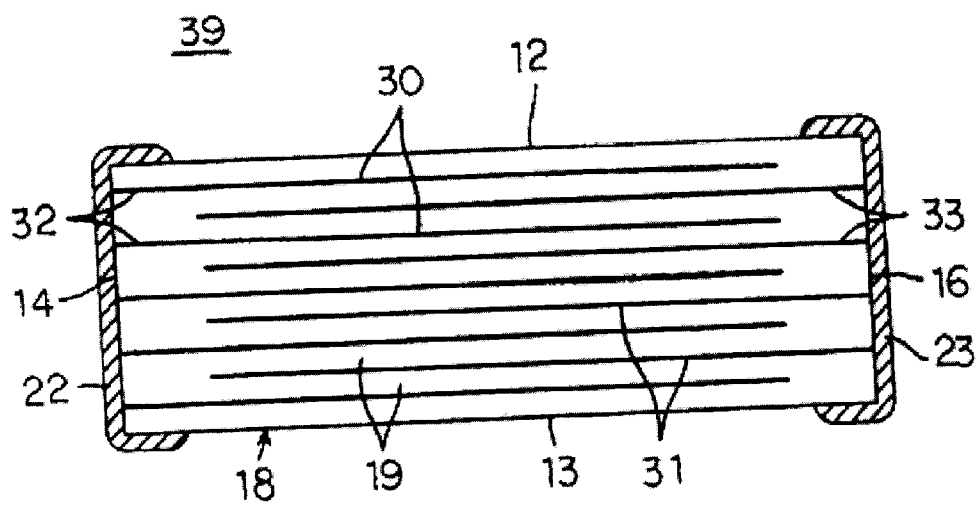
FIG. 6 shows a multilayer capacitor as example 2 for comparison, in which the view is equivalent to the view of FIG. 2.

Regarding the multilayer capacitor 11 according to the present preferred embodiment of the present invention, a description will be provided of a comparison between examples 1, 2 and the present preferred embodiment in order to evaluate the capacitance and ESL of the multilayer capacitor 11. The examples 1 and 2 are shown in FIGS. 5 and 6, both of which are equivalent to FIG. 2. In FIGS. 5 and 6, the same reference numerals as those shown in FIG. 2 are used to represent equivalent elements, and the explanation thereof will be omitted.

A multilayer capacitor 38 shown in FIG. 5 includes only a first low ESL internal electrode 26 and a second ESL internal electrode 27 which define internal electrodes. The low ESL internal electrodes 26 and 27 are electrically connected to first main surface terminal electrodes 20 or second main surface terminal electrodes 21 via a first conductive via-hole 28 or a second conductive via-hole 29.

A multilayer capacitor 39 shown in FIG. 6 includes only first high capacitance internal electrodes 30 and second high capacitance internal electrodes 31 defining internal electrodes. Thus, the multilayer capacitor 39 does not include main surface terminal electrodes or conductive via-holes.

The other structural elements of each of the multilayer capacitors 38 and 39 are substantially the same as those in the multilayer capacitor 11 shown in FIG. 2.

Table 1 shows a result obtained by evaluating capacitance and ESL of each of the multilayer capacitor 11 according to the present preferred embodiment of the invention, the multilayer capacitor 38 as the first example for comparison, and the multilayer capacitor 39 as the second example for comparison.

TABLE 1

|  | CAPACITANCE ($\mu$F) | ESL (pH) |
| --- | --- | --- |
| PREFERRED EMBODIMENT | 1.0 | — |
| EXAMPLE 1 | 0.6 | 4.5 |
| EXAMPLE 2 | 1.1 | 15.6 |

In Table 1, the values of ESL were obtained by a resonance method. In the resonance method, the frequency characteristics of impedance of each multilayer capacitor as a sample are obtained. Then, based on the frequency $f_0$ of the minimal point of the frequency characteristics (a series resonance point between the capacitance component C and ESL of the capacitor), the value of ESL is obtained by the following equation.

$$ESL = 1/\{(2\pi \cdot f_0)^2 \cdot C\}$$

In Table 1, the ESL of the present preferred embodiment is not shown. This is because the present preferred embodiment has a plurality of the minimal points in the frequency characteristics of the impedance, and it was thereby impossible to specify one of them. However, in a frequency band higher than a frequency band in which the plurality of minimal points appeared, that is, in a frequency band in which the impedance of the multilayer capacitor is mainly set by the value of ESL, the impedance-change curve of the present preferred embodiment almost coincided with the curve of the example 1 for comparison. Thus, the ESL: of the present preferred embodiment was substantially the same as the ESL (approximately 4.5 pH) of the example 1.

As shown in Table 1, in the example 1 for comparison, since the multilayer capacitor 38 includes only the low ESL internal electrodes 26 and 27, a sufficiently low ESL could be obtained, while large capacitance could not be obtained. In the example 2 for comparison, since the multilayer capacitor 39 includes only the high capacitance internal electrodes 30 and 31, large capacitance could be obtained, while ESL could not be sufficiently reduced.

In contrast, in the present preferred embodiment of the present invention, the multilayer capacitor 11 includes both the low ESL internal electrodes 26 and 27, and the high capacitance internal electrodes 30 and 31. Thus, a capacitance equivalent to that of the example 2 could be obtained.

Figure 7:
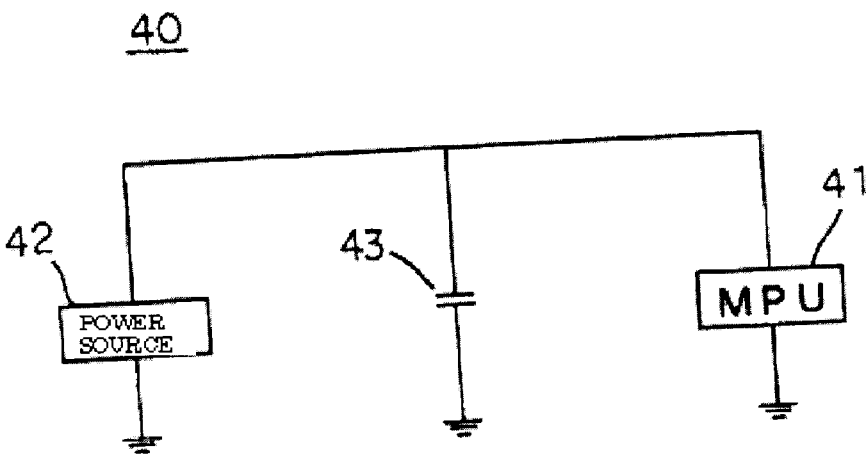
FIG. 7 is a view of a decoupling circuit used to evaluate ESL.

Furthermore, in order to check the ESL of the present preferred embodiment, a decoupling circuit 40 as shown in FIG. 7 was used. The decoupling circuit 40 has a MPU chip 41 and a power source unit 42 for supplying a power source to the MPU chip 41. A decoupling capacitor 43 is connected to a power source circuit located between the power source unit 42 and the MPU chip 41.

In the decoupling circuit 40, a sample multilayer capacitor defining the decoupling capacitor 43 is used. With the use of the multilayer capacitor, the quick power supply function of the decoupling capacitor 43 was evaluated by changing the operational status of the MPU chip 41 from a sleep mode to an active mode.

As a result, in the present preferred embodiment, at a responsive speed that is substantially equal to that of the example 1, a required electric charge could be supplied to the MPU chip 41. In addition, obviously, the electric charge could be supplied during a time that is substantially equal to that of the example 2.

Figure 17:
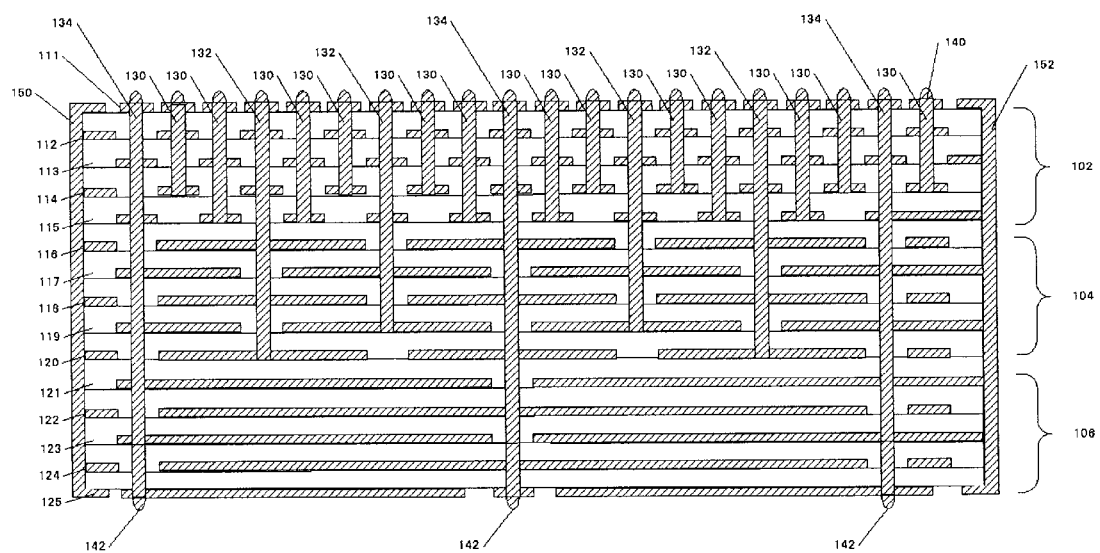
FIG. 17 shows a cross-sectional view of a multilayer, multiple tier array capacitor in accordance with another embodiment of the present invention.

FIG. 17 shows a cross-section of a multilayer, multiple tier array capacitor 100 in accordance with another embodiment of the present invention. Capacitor 100 includes two or more tiers 102, 104, 106 of capacitance, in one embodiment. Each tier 102, 104, 106 includes multiple layers 111–125 of patterned conductive material. In the configuration shown, top tier 102 includes layers 111–115, middle tier 104 includes layers 116–120, and bottom tier 106 includes layers 121–125. Each layer 111–125 of patterned conductive material is separated by a dielectric layer, and each set of adjacent layers and intermediate dielectric layers form a parallel plate capacitor. Thus, for example, layers 111 and 112 form a parallel plate capacitor, as do layers 113 and 114, etcetera.

The tiers 102, 104, 106 and layers 111–125 of patterned conductive material are electrically connected through conductive vias 130, 132, 134, referred to herein as "capacitor vias," which extend downward from a plurality of pairs of first main surface terminal electrodes 140 located on a first main surface (e.g., the top surface) of the capacitor. In one embodiment, some of the capacitor vias 134 extend all the way through the capacitor to a plurality of pairs of second main surface terminal electrodes 142 located on a second main surface (e.g., the bottom surface) of the capacitor. Some of the vias 130, 132, 134 associated with a tier make contact with every other layer of the tier, while others of the vias 130, 132, 134 associated with the tier make electrical contact with the remainder of the layers of the tier.

In addition, the tiers 102, 104, 106 and layers 111–125 of patterned conductive material are electrically connected to a plurality of first and second side surface terminal electrodes 150, 152, which are disposed on one or more sides of the capacitor body. In one embodiment, the first and second side surface terminal electrodes 150, 152 are adjacent to each other on opposing side surfaces.

In this manner, the layers can alternate between being connected to power and ground (e.g., Vcc and Vss), thus providing a capacitive charge across each set of adjacent layers. Thus, layers 111, 113, 115, 117, 119, 121, 123, and 125 can be connected to power, and layers 112, 114, 116, 118, 120, 122, and 124 can be connected to ground, or vice versa. In one embodiment, vias 134 extend to the bottom surface of the capacitor. Accordingly, electrical connections can be made through top electrodes 140 and/or bottom electrodes 142, as well as through side surface terminal electrodes 150, 152.

In the embodiment shown in FIG. 17, tiers 102, 104, 106 are stacked in a vertical direction. Thus, tiers 104 and 106 are located substantially underneath tier 102. Accordingly, the capacitor vias 132 that extend through the middle tier 104 extend also through the layers 111–115 of the top tier 102, making electrical contact with every other one of the layers in the top tier 102. In addition, the capacitor vias 134 that extend through the bottom tier 106 extend also through the layers 111–120 of the top and middle tiers 102, 104, making electrical contact with every other one of the layers in the top and middle tiers 102, 104. In an alternate embodiment, some of all of the vias 132, 134 that extend through the middle and bottom tiers 104, 106 could be insulated from the layers of the top and middle tiers 102, 104.

Although three tiers 102, 104, 106 of capacitance are shown in FIG. 17, more or fewer tiers could be implemented in various embodiments. In addition, although each tier 102, 104, 106 is shown to have five layers, more or fewer layers could be included in each tier. Additionally, although the layers 111–125 and tiers 102, 104, 106 are shown to be adjacent to each other, the various layers 111–125 and/or tiers 102, 104, 106 could be separated from each other by one or more signal-carrying or other layers. Also, the number of vias 130, 132, 134 connecting through each tier 102, 104, 106, and the number of top connectors 140 and/or bottom connectors 142 could be different from the numbers shown in FIG. 17.

The number of vias 130, 132, 134 that connect to and pass through the layers 111–125 within each tier 102, 104, 106 affects the inductance and capacitance of the tier. Basically, the number of vias is inversely proportional to the inductance and capacitance of each tier.

The capacitance value of each tier 102, 104, 106 is proportional to the area of the conductive layers 111–125 that comprise the tier and the thickness of the dielectric layers between sets of conductive layers 111–125. Conductive layers 111–115 in top tier 102 have multiple via through holes, which enable vias 130, 132, 134 to pass through to lower layers. Each via through hole that passes through a layer 111–115 decreases the conductive area of the layer. In one embodiment, top tier 102 has a greater number of vias 130, 132, 134 that connect to and pass through its layers 111–115. Middle tier 104 has fewer vias 132, 134 connecting to and passing through its layers 116–120, and bottom tier 106 has even fewer vias 134 connecting to and passing through its layers 121–125. Thus, the conductive areas of top tier layers 111–115 is the smallest of three tiers, and the conductive areas of bottom tier layers 121–125 is the greatest of the three tiers. Accordingly, top tier 102 has the lowest inductance and capacitance of the three tiers 102, 104, 106, and bottom tier 106 has the highest inductance and capacitance of the three tiers 102, 104, 106.

Besides being inversely proportional to the number of vias connecting to and passing through each tier, the inductance of each tier 102, 104, 106 is proportional to the distance of the tier from the load. When the load is connected to first main surface electrodes 140, in accordance with one embodiment, top tier 102 is closest to the load, middle tier 104 is farther from the load, and bottom tier 106 is the farthest from the load. Accordingly, top tier 102 has the lowest inductance to the load, middle tier 104 has more inductance, and bottom tier 106 has the greatest inductance. Because of the above-described inductance and capacitance characteristics, a tier can be defined as a set of layers having particular inductance and capacitance values.

Figure 18:
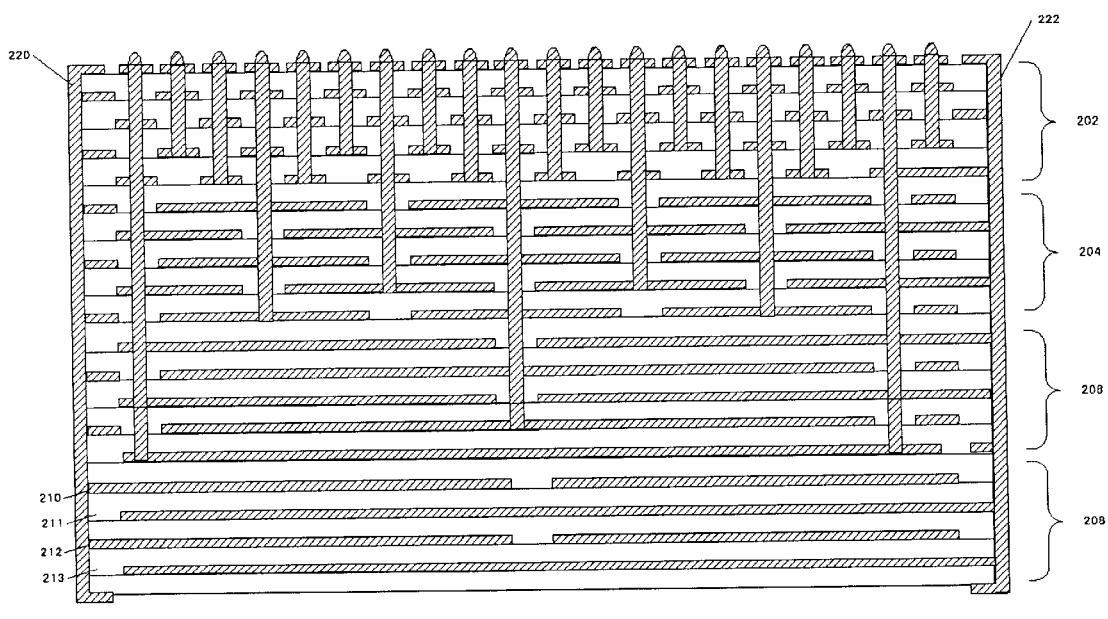
FIG. 18 shows a cross-section of a multilayer, multiple tier array capacitor in accordance with still another embodiment of the present invention.

FIG. 18 shows a cross-section of a multilayer, multiple tier array capacitor 200 in accordance with still another embodiment of the present invention. Capacitor 200 is similar to the capacitor 100 described in conjunction with FIG. 17, in that capacitor 200 includes two or more tiers 202, 204, 206, 208 of capacitance, in one embodiment. Capacitor 200 differs from the capacitor 100 described in conjunction with FIG. 17, however, because capacitor 200 includes one tier 208 of capacitance through which capacitor vias do not extend. Accordingly, the layers 210, 211, 212, and 213 of tier 208 are electrically connected to a plurality of side surface terminal electrodes 220, 222, but not to main surface terminal electrodes (e.g., electrodes 142, FIG. 17). Because the capacitance value of each tier 202, 204, 206, 208 is proportional to the area of the conductive layers that comprise each tier, and the areas of the conductive layers 210-113 of bottom tier 208 are the largest, the bottom tier 208 has the highest inductance and capacitance of the four tiers 202, 204, 206, 208.

Figure 16:
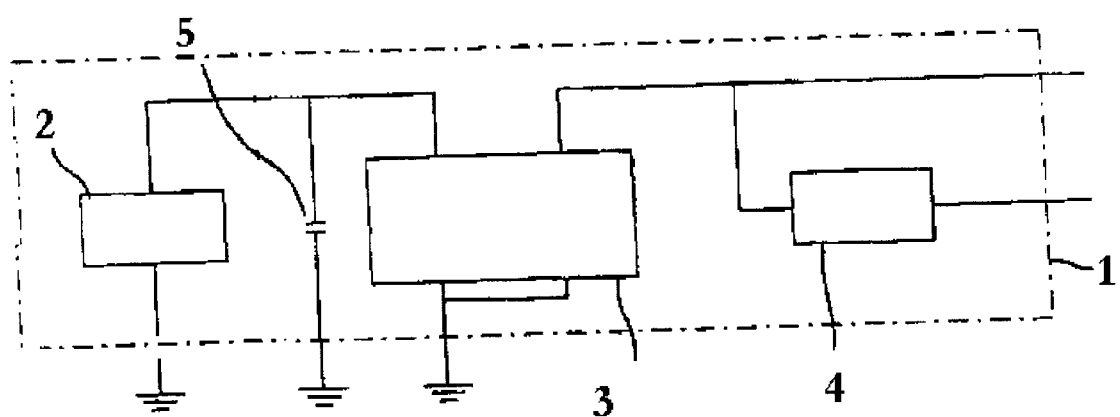
FIG. 16 is a block diagram illustrating a connection structure relating to a MPU and a power source unit, which is characteristic in the present invention.

The multilayer capacitor according to various preferred embodiments of the present invention, for example, can be effectively used as a decoupling capacitor 5 incorporated in the MPU 1 shown in FIG. 16 mentioned above. In this way, regarding a typical structure of the MPU including the multilayer capacitor according to various preferred embodiments of the present invention as the decoupling capacitor, a description will be given by referring to structural examples shown in FIGS. 8 and 9.

Figure 8:
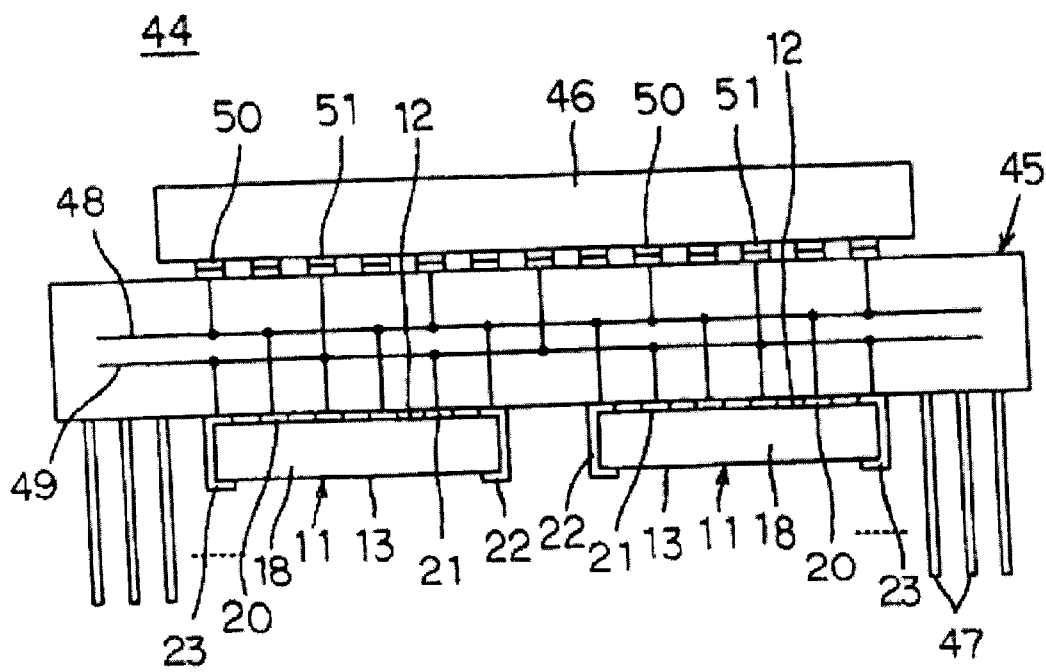
FIG. 8 is a sectional view illustrating the structure of MPU including the multilayer capacitor shown in FIG. 1 defining a decoupling capacitor.

In FIG. 8, a MPU 44 includes a wiring board 45 having a f multilayer structure. On the upper surface of the wiring board 45, a MPU chip 46 is surface-mounted, for example, via a bump electrode and other suitable element. On the lower surface of the wiring board 45, there is surface-mounted the multilayer capacitor in accordance with preferred embodiments of the present invention, for example, the multilayer capacitor 11 shown in FIGS. 1 to FIGS. 4A and 4B. The multilayer capacitor 11 defines a decoupling capacitor. Preferably, the multilayer capacitor 11 is arranged right below the MPU chip 46, and a first main surface 12 of the main body 48 of the multilayer capacitor 11 is positioned on the side of the MPU chip 46. In addition, the wiring board 45 includes a plurality of terminal leads 47 used when mounted on a motherboard of a computer (not shown). The terminal leads 47 may be replaced with terminal electrodes defined by conductive films provided on the surface of the wiring board 45.

On the surface and inside of the wiring board 45, as schematically illustrated, conductive wires required for the MPU 44 are disposed. With the conductive wires, the connections as shown in FIG. 16 are achieved.

As major conductive wires, inside the wiring board 45, a power source conductive wire 48 and a ground-side conductive wire 49 are provided.

The power source conductive wire 48 is electrically connected to, for example, a first main surface terminal electrode 20 and a first side surface terminal electrode 22, and is also electrically connected to a specific terminal 50 of the MPU chip 46.

In addition, the ground-side conductive wire 49 is electrically connected to, for example, a second main surface terminal electrode 21 and a second side surface terminal electrode 23, and is also electrically connected to a specific terminal 51 of the MPU chip 46.

In FIG. 8, the illustration of a memory equivalent to a memory 4 shown in FIG. 5 is omitted.

Figure 9:
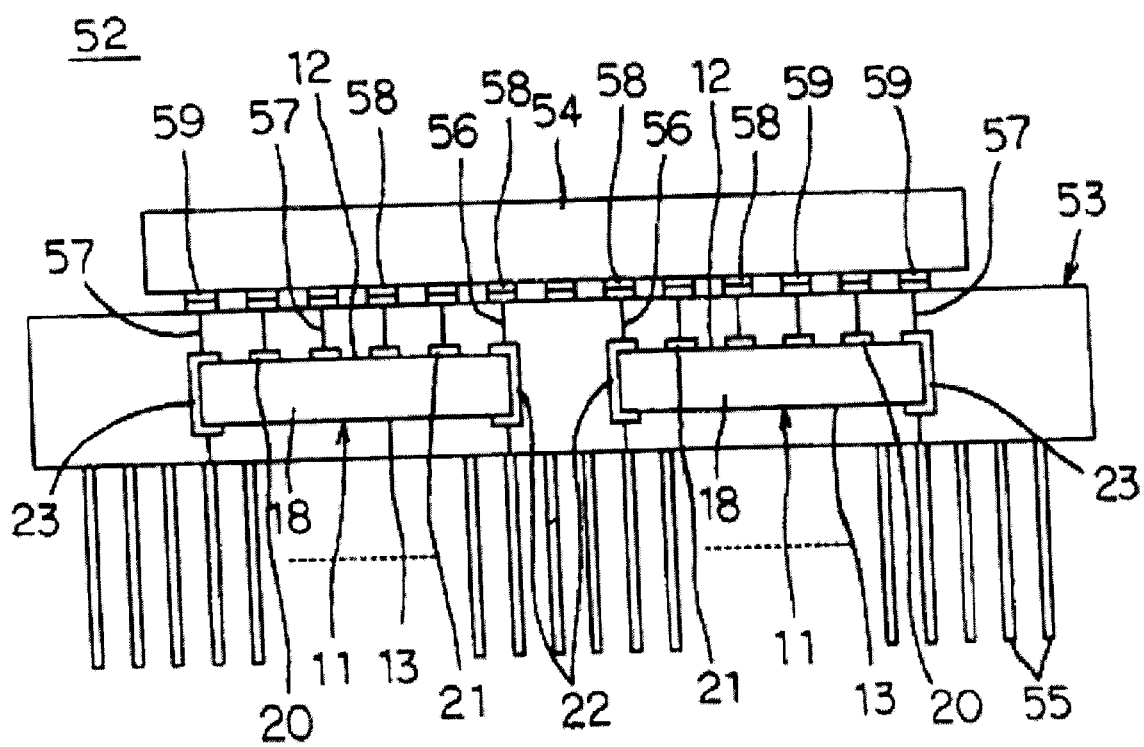
FIG. 9 is a sectional view illustrating the structure of MPU that is different from the structure of the MPU show in FIG. 8, in which the MPU uses the multilayer capacitor shown in FIG. 1 defining a decoupling capacitor.

Next, a MPU 52 shown in FIG. 9 includes a wiring board 53. On the upper surface of the wiring board 53, a MPU chip 54 is surface-mounted, for example, via a bump electrode or other suitable mounting element. In addition, inside the wiring board 53, the multilayer capacitor 11 defining a decoupling capacitor is disposed right below the MPU chip 54. Preferably, in the multilayer capacitor 11, the main surface 12 of the main body 18 is positioned on the side of the MPU chip 54. Furthermore, the wiring board 53 includes a plurality of terminal leads 55 used when mounted on the motherboard of a computer (not shown). The terminal leads 55 may be replaced with terminal electrodes defined by conductive films provided on the surface of the wiring board 53.

On the surface and inside of the wiring board 53, as schematically illustrated, conductive wires required for the MPU 52 are disposed. With the conductive wires, connections as shown in FIG. 16 are obtained.

As major conductive wires, inside the wiring board 53, a power source conductive wire 56 and a ground-side conductive wire 57 are provided.

The power source conductive wire 56 is electrically connected to, for example, a first main surface terminal electrode 20 and a first side surface terminal electrode 22 of the multilayer capacitor 11, and is also electrically connected to a specific terminal 58 of the MPU chip 54.

In addition, the ground-side conductive wire 57 is electrically connected to, for example, a second main surface terminal electrode 21 and a second side surface terminal electrode 23 of the multilayer capacitor 11, and is also electrically connected to a specific terminal 59 of the MPU chip 54.

In addition, the power source conductive wire 56 connected to the side surface terminal electrode 22 and the ground-side conductive wire 23 connected to the side surface terminal electrode 23 are electrically connected to specific ones of the terminal leads 55. As mentioned above, the connection can be easily achieved, since the side surface terminal electrodes 22 and 23 have portions extending to the main surfaces 12 and 13 of the main body 18. When a current is arranged to flow through the side surface terminal electrodes 22 and 23, wiring inside the wiring board 53 can be greatly simplified. In addition, the wire length can be shortened. As a result, inductance occurring due to wiring can be greatly reduced.

In FIG. 9, the illustration of a memory equivalent to a memory 4 shown in FIG. 16 is omitted.

As in the above-described structure, when the side surface terminal electrodes 22 and 23 are used to allow input currents supplied to the MPU chip 54 and output currents from the MPU chip 54 to flow, in order to provide a sufficient current capacitance, the total cross-sectional area of the side surface terminal electrodes 22 and 23 is preferably larger than those of the conductive via-holes 28 and 29 (See FIG. 2), which are disposed inside the main body 18.

Next, by variously changing the total cross-sectional areas of the side surface terminal electrodes 22 and 23, the current capacitance of each case was obtained. The results are shown in Table 2.

TABLE 2

| TOTAL CROSS-SECTIONAL AREA (mm$^2$) | CURRENT CAPACITANCE (A) |
|---|---|
| 3.5 × 10$^{-4}$ | 8.4 |
| 5.0 × 10$^{-4}$ | 12.2 |
| 2.1 × 10$^{-3}$ | 23.6 |
| 5.0 × 10$^{-3}$ | 32.7 |
| 1.0 × 10$^{-2}$ | 40 or more |

In Table 2, each current capacitance indicates the value of a current required when the temperature of a sampling multilayer capacitor rises by about 25° C. in a case in which an AC current of about 120 Hz is supplied to the multilayer capacitor.

As shown in FIG. 2, as the total cross-sectional area of the side surface terminal electrodes 22 and 23 increases, the current capacitance becomes larger. With the recent high-speed performance of a MPU, power consumption has been increasing. Thus, by increasing the total cross-sectional area of the side surface terminal electrodes 22 and 23, a sufficient amount of current capacitance can be obtained. From a practical point of view, preferably, the total cross-sectional area of the side surface terminal electrodes 22 and 23 is preferably substantially equal to or more than approximately 5.0×10$^{-4}$ mm$^2$, and more preferably, it is substantially equal to or more than approximately 1.0×10$^{-2}$ mm$^2$.

Figure 10:
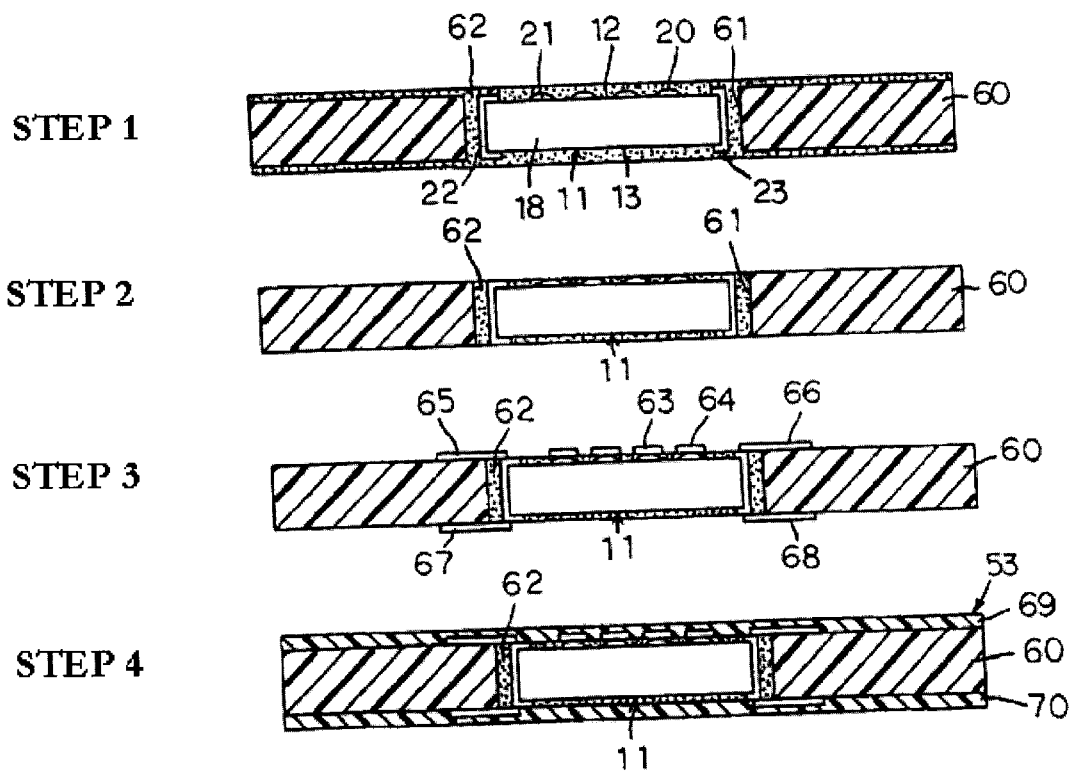
FIG. 10 shows a series of sectional views sequentially illustrating a typical process of a method for manufacturing a wiring board shown in FIG. 9.

FIG. 10 shows an example of a method for manufacturing the wiring board 53 containing the multilayer capacitor 11 as shown in FIG. 9.

First, as shown in step 1, there is provided a core board 60, on which a through-hole 61 large enough to contain the multilayer capacitor 11 is disposed.

Next, the multilayer capacitor 11 is inserted in the through-hole 61 to be fixed by a resin material 62. The resin material 62 is filled in a space between the inner peripheral surface of the through-hole 61 and the multilayer capacitor 11. In addition, both main surfaces of the core board 60 and main surfaces 12 and 13 of the multilayer capacitor 11 are coated by the resin material 62.

Then, as shown in step 2, grinding is performed from the top and bottom of the core board 60, by which the resin materials 62 formed on both main surfaces of the core board 60 and the main surfaces 12 and 13 of the multilayer capacitor 11 are removed. This processing permits the main surface terminal electrodes 20 and 21 and portions of the side surface terminal electrodes 22 and 23 positioned on the main surfaces 12 and 13 to be exposed.

Next, as shown in step 3, wiring conductive films 63 to 68 are arranged to be connected to the main surface terminal electrodes 20 and 21 and the exposed portions of the side surface terminal electrodes 22 and 23.

Then, as shown in step 4, resin plate members 69 and 70 are laminated along the main surfaces of the core board 60. After this, holes are formed in the resin plate members 69 and 70 and necessary wiring is disposed therein, by which the wiring board 53 shown in FIG. 9 is completed.

In the method for manufacturing the wiring board 53, the resin material 62 formed as shown in step 1 is ground, and as shown in step 2, the necessary portions of the main surface terminal electrodes 20 and 21 and the side surface terminal electrodes 22 and 23 are exposed. With grinding, in order to expose the necessary portions of the resin plate members 69 and 70 without fail in a proper condition, preferably, the main surface terminal electrodes 20 and 21 have heights that are substantially equal to or more than approximately 1.0×10$^{-2}$ mm on the first main surface 12 of the main body 18. In addition, preferably, the side surface terminal electrodes 22 and 23 have heights that are substantially equal to or more than approximately 1.0×10$^{-2}$ mm on the first and second main surfaces 12 and 13 of the main body 18. Thus, when the main surface terminal electrodes 20 and 21 and the side surface terminal electrodes 22 and 23 are formed, for example, screen printing is applied, in which the thickness of printing is controlled in such a manner that the above-mentioned desired heights can be obtained.

However, in order to obtain the structure in which the multilayer capacitor is contained in the wiring board, methods other than the method shown in FIG. 10 may be used. For example, instead of forming the through-hole 61, a recess may be formed in the core board 6 so as to contain the multilayer capacitor 11 therein. Alternatively, through-holes may be disposed in advance in the resin plate members 69 and 70 to be laminated.

Figure 11:
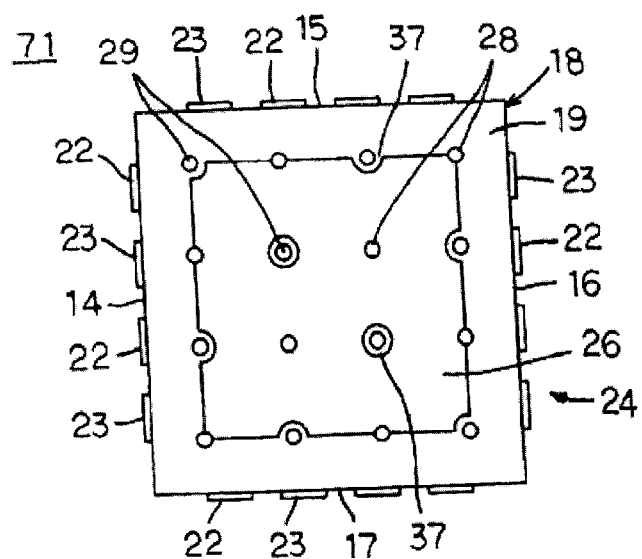
FIG. 11 shows a multilayer capacitor according to another preferred embodiment of the present invention, in which the view is equivalent to the view of FIG. 3A.

FIG. 11 shows a multilayer capacitor 71 according to another preferred embodiment of the present invention. This capacitor 71 is substantially equivalent to that shown in FIG. 3A. In FIG. 11, the same reference numerals are assigned to the same elements as those shown in FIG. 3A, and the explanation thereof will be omitted.

FIG. 11 shows only the first low ESL internal electrode 26, and the illustration of the second low ESL internal electrode 27 is omitted. In the multilayer capacitor 71, some of the first and second conductive via-holes 28 and 29 are positioned in the peripheries of the first and second low ESL internal electrodes 26 and 27.

In addition, in the multilayer capacitor 71 shown in FIG. 11, the first and second low ESL internal electrodes 26 and 27 do not have leading electrodes for electrically connecting the first and second low ESL internal electrodes 26 and 27 to the first and second side surface terminal electrodes 22 and 23. This is different from the case of the multilayer capacitor 11 shown in FIG. 3. However, the multilayer capacitor 71 shown in FIG. 11 may have the leading electrodes 34 and 35 shown in FIG. 3.

Figure 12:
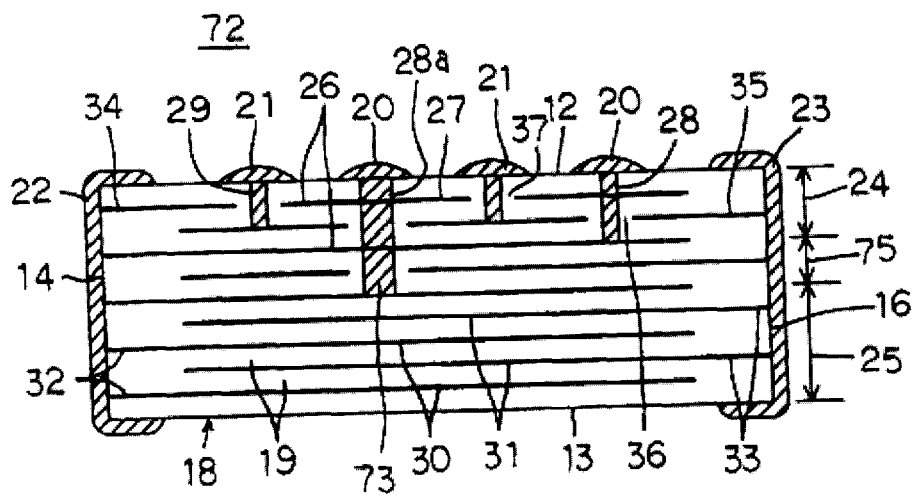
FIG. 12 shows a multilayer capacitor according to another preferred embodiment of the present invention, the view being equivalent to FIG. 2.

FIG. 12 shows a multilayer capacitor 72 according to another preferred embodiment of the present invention. This preferred embodiment is substantially equivalent to FIG. 2. In FIG. 12, the same reference numerals are assigned to equivalent elements shown in FIG. 2, and the explanation thereof will be omitted.

The multilayer capacitor 72 shown in FIG. 12, in addition to the first and second conductive via-holes 28 and 29, further has a third conductive via-hole 73 electrically connecting at least one of the first and second low ESL internal electrodes 26 and 27 to at least one of the first and second high capacitance internal electrodes 30 and 31.

The cross-sectional area of the third conductive via-hole 73 determines a current capacitance that the multilayer capacitor 72 can provide, as with the case of the side surface terminal electrodes 22 and 23. Therefore, in order to have a sufficient current capacitance, the third conductive via-hole 73 is designed in such a manner that the cross-sectional area thereof is larger than the cross-sectional areas of the first and second conductive via-holes 28 and 29. In this preferred embodiment, substantially the same cross-sectional area as that of the third conductive via-hole 73 is preferably provided to a first conductive via-hole 28a formed on the same axial line as that of the third conductive via-hole 73 to be connected thereto.

In the multilayer capacitor 72 shown in FIG. 12, the third conductive via-hole 73 is provided. In addition, the low ESL internal electrode 26 is electrically connected to the side surface terminal electrode 22 via the leading electrode 34 and the low ESL internal electrode 27 is electrically connected to the side surface terminal electrode 23 via the leading electrode 35. With this arrangement, the current capacitance is determined by the total cross-sectional area of the side surface terminal electrodes 22 and 23 and the third conductive via-hole 73. As in the case of the multilayer capacitor 11, the total cross-sectional area thereof is preferably substantially equal to or more than approximately $5.0 \times 10^{-4}$ mm$^2$, and more preferably, the area may be substantially equal to or more than approximately $1.0 \times 10^{-2}$ mm$^2$.

The significance of the third conductive via-hole 73 connecting the low ESL section and the high capacitance section will now be described.

Figure 13:
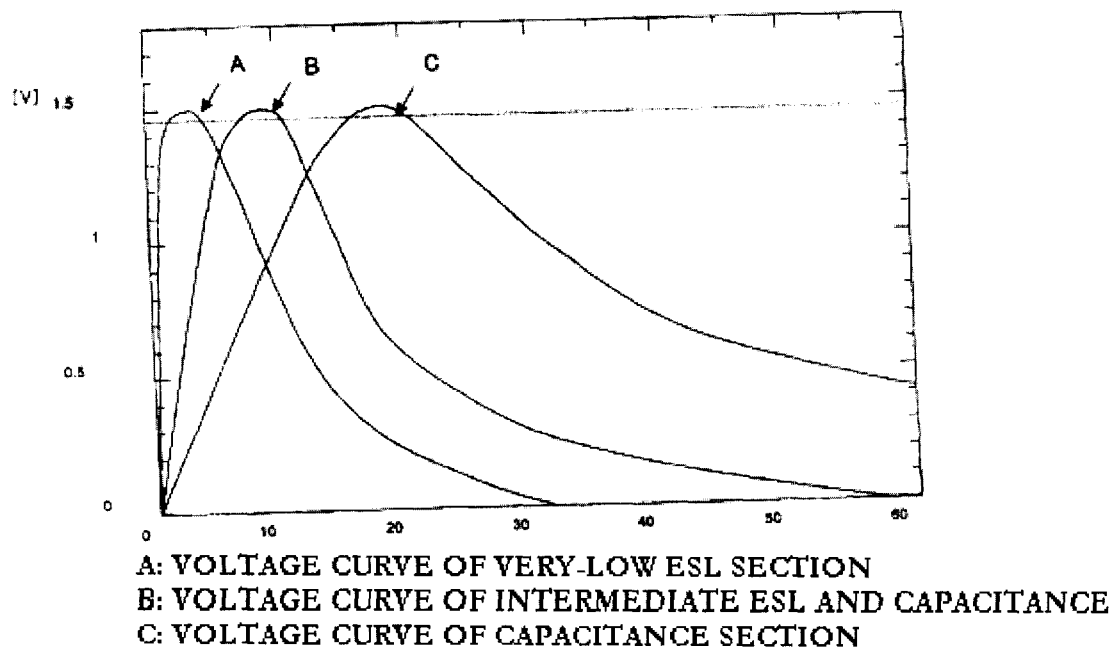
FIG. 13 is a graph showing the obtained voltage characteristics versus time for the various sections of the capacitor according to a preferred embodiment of the present invention.

As is shown in FIG. 13, the third conductive via-hole 73 defines an intermediate section (shown in voltage curve B) between the low ESL section (shown in voltage curve A) and the high capacitance section (voltage curve C). The intermediate section B has a capacitance that is higher than that of the low ESL section and has an ESL that is lower than that of the high capacitance section. As a result, the voltage characteristics shown in FIG. 13 are obtained.

In the graph shown in FIG. 13, the vertical axis indicates voltages at both ends of a capacitor (voltages supplied to an MPU) and the horizontal axis indicates elapsed time (nanoseconds). An input voltage is 1.5V, for example, in the graph of FIG. 13.

With the low ESL section and the high capacitance section connected by the third conductive via-hole 73, a voltage can be supplied before voltage supply from a power source. First, a voltage is supplied to the low ESL section immediately, that is, in a few nanoseconds. This is shown by curve A. In this case, the voltage supply is performed at a few clock intervals when an operational frequency of the MPU is GHz. Then, when the low ESL section runs out of charge and the supplied voltage is thereby reduced, subsequently, the high capacitance section takes turns performing a longer voltage supply as shown by the curve C in FIG. 13.

Recently, there has been a tendency in which the lower the voltage supplied to an MPU, the narrower the allowable voltage range. Since there is a gap between the voltage curves A and C as shown in the graph in FIG. 13, a voltage is temporarily reduced after being supplied from the low ESL section.

However, when the section having intermediate levels of capacitance and ESL as shown by the curve B is provided, reduction in the supplied voltage can be minimized, thus permitting voltage supply to be performed as shown by the curve C in FIG. 13. Therefore, stable voltage supply can be performed in a manner that is adapted to a narrow allowable voltage range.

In the multilayer capacitor 72 shown in FIG. 12, when the low ESL internal electrode 26 does not have the leading electrode 34 and the low ESL internal electrode 27 does not have the leading electrode 35 and the low ESL internal electrode 26 is not connected to the side surface terminal electrode 22 and the low ESL internal electrode 27 is not connected to the side surface terminal electrode 23, the cross-sectional area of only the third conductive via-hole 73 is preferably substantially equal to or more than approximately $5.0 \times 10^{-4}$ mm , and more preferably, the area is substantially equal to or more than approximately $1.0 \times 10^{-2}$ mm$^2$.

Each of FIGS. 14A and 14B and 15A and 15B shows a multilayer capacitor 74 according to another preferred embodiment of the present invention. These figures are equivalent to FIGS. 3A and 3B and FIGS. 4A and 4B. In FIGS. 14A and 14B and FIGS. 15A and 15B, the same reference numerals are assigned to equivalent elements shown in FIGS. 3A and 3B and FIGS. 4A and 4B, and the explanation thereof will be omitted.

Figure 14A:
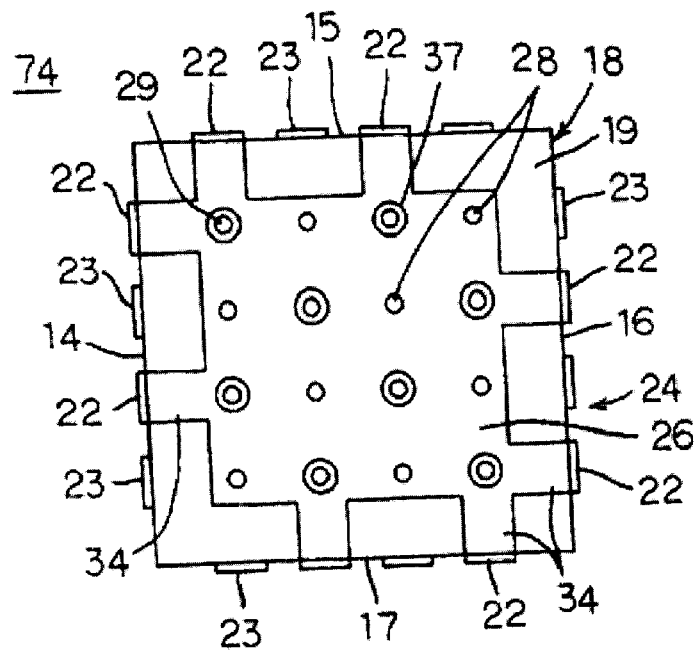
FIGS. 14A and 14B show plan views of a multilayer capacitor according to another preferred embodiment of the present invention, in which the views are equivalent to FIGS. 3A and 3B.
Figure 14B:
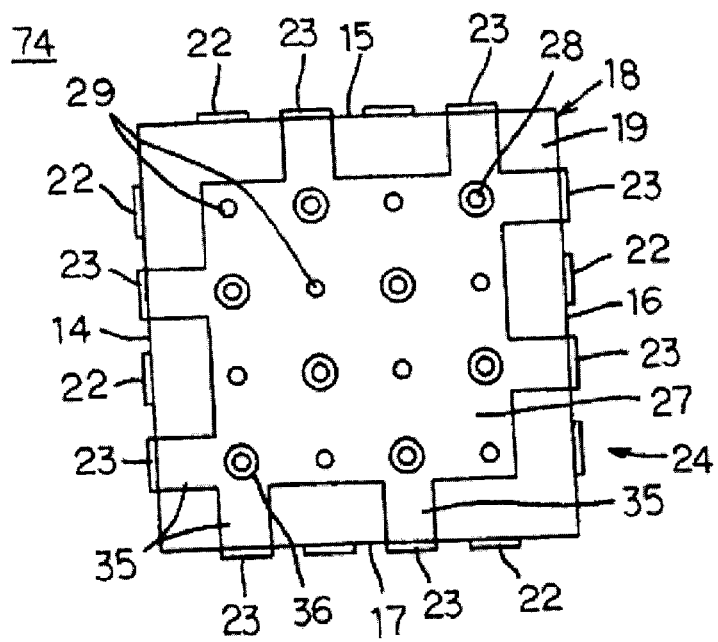
Figure 15A:
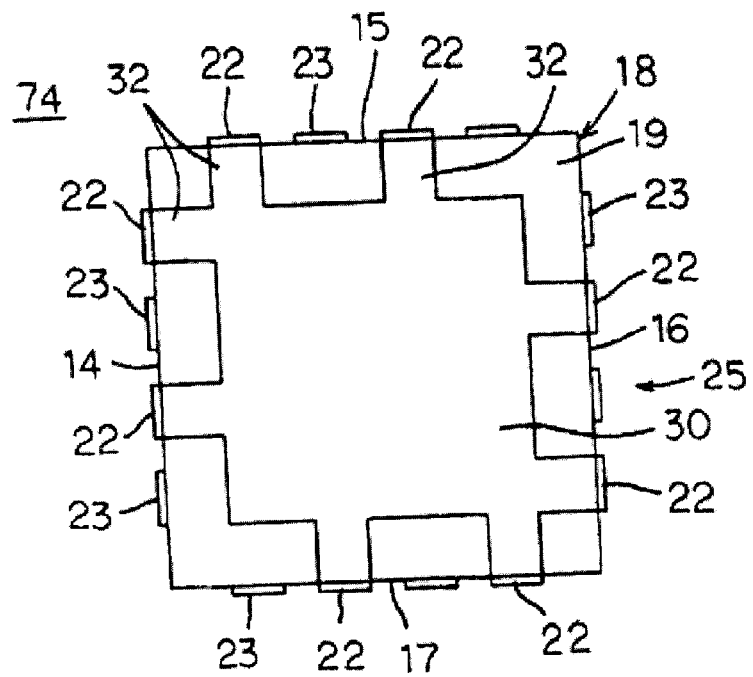
FIGS. 15A and 15B show plan views of the multilayer capacitor shown in FIGS. 14A and 14B, in which the views are equivalent to FIGS. 4A and 4B.
Figure 15B:
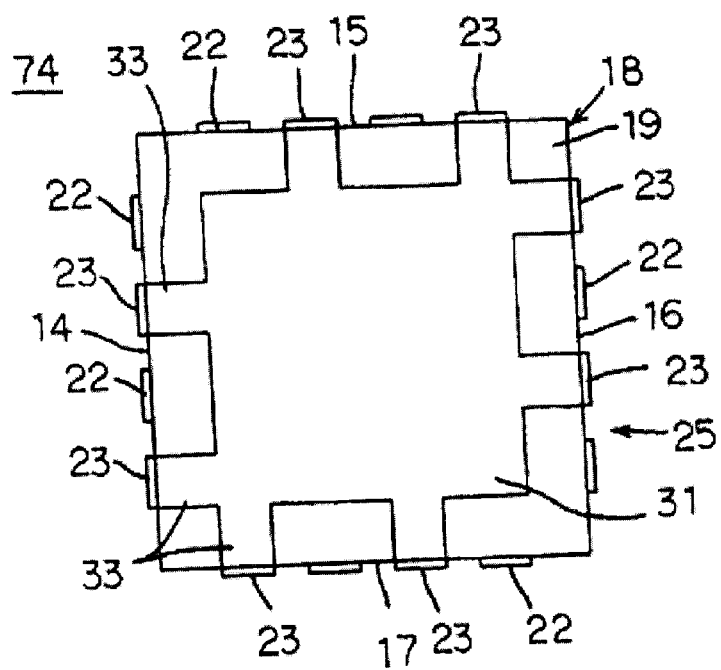

In the multilayer capacitor 74 shown in each of FIGS. 14A and 14B, the first side surface terminal electrodes 22 are adjacent to the second side surface terminal electrodes 23 on the side surfaces 14 to 17 of the main body 18. However, when viewed along the periphery of the capacitor 74 moving along the four side surfaces 14 to 17, some of the first and second side surface terminal electrodes 22 and 23 are not adjacent to each other (for example, at corners of the capacitor 74).

In the multilayer capacitor 74, the first and second side surface terminal electrodes 22 and 23 are arranged to extend in a direction in which the first and second main surface terminal electrodes 20 and 21 are arranged. In other words, one first side surface terminal electrode 22 is positioned on a specific side surface in such a manner that the first side surface terminal electrode 22 is positioned on a hypothetical line passing one main surface terminal electrode 20 and one main surface terminal electrode 21. In addition, one second side surface terminal electrode 23 is provided on a side surface opposing the specified side surface. In this situation, each of the second side surface terminal electrodes 23 is adjacent to each of the first main surface terminal electrodes 20, and at the same time, each of the first side surface terminal electrodes 22 is adjacent to the second main surface terminal electrodes 21.

As described above, in the multilayer capacitor in accordance with preferred embodiments of the present invention, the first and second main surface terminal electrodes are provided on the first main surface of the main body of the multilayer capacitor, and the first and second side surface electrodes are provided on the side surfaces of the main body. The main body is divided into a low ESL section of the first main surface side and a high capacitance section of the second main surface side. The low ESL section includes first and second low ESL internal electrodes opposing each other via specified dielectric layers, and a first conductive via-hole electrically connecting the first low ESL internal electrode to the first main surface terminal electrode and a second conductive via-hole electrically connecting the second low ESL internal electrode to the second main surface terminal electrode. The high capacitance section includes first and second high capacitance internal electrodes opposing each other via specified dielectric layers, and a first leading electrode electrically connecting the first high capacitance internal electrode to the first side surface terminal electrode and a second leading electrode electrically connecting the second high capacitance internal electrode to the second side surface terminal electrode.

As a result, in the low ESL section, magnetic fluxes generated by the currents flowing in the various directions are effectively cancelled. Thus, the occurrence of magnetic fluxes can be suppressed and the current lengths can be shortened. Consequently, the ESL of the multilayer capacitor 11 is minimized.

In the high capacitance section, there is no need to dispose a conductive via-hole. Thus, a gap is not necessary for an internal electrode to be insulated from the conductive via-hole. As a result, the entire area of the high capacitance internal electrodes can be used for obtaining capacitance.

Therefore, preferred embodiments of the present invention provide a multilayer capacitor that minimizes ESL and achieves very large capacitance.

Thus, the multilayer capacitor according to preferred embodiments of the present invention has a high resonant frequency, and a frequency band in which the multilayer capacitor is used in a high frequency band. As a result, the multilayer capacitor of preferred embodiments of the present invention is highly adaptable to electronic circuits having high frequencies. For example, as a bypass capacitor or a decoupling capacitor used in high frequency circuits, the multilayer capacitor of preferred embodiments of the present invention is very effectively used.

In addition, because the multilayer capacitor has very large capacitance, for example, it is possible to obtain a sufficiently large capacitance required with the increasing processing amount of the recent micro-processing units (MPU).

In addition, for the decoupling capacitor combined with a MPU chip and other such components, it is necessary to have a quick power supply function. Since the multilayer capacitor of preferred embodiments of the present invention can reduce ESL, when operating with a quick power supply function, the multilayer capacitor is sufficiently adaptable to high-speed performance.

According to preferred embodiments of the present invention, the above-mentioned magnetic flux is cancelled and current lengths are shortened to effectively minimize ESL.

The multilayer capacitor preferably includes a plurality of pairs of first and second main surface terminal electrodes, which are arranged in such a manner that the first and second main surface terminal electrodes are adjacent to each other.

The multilayer capacitor also preferably includes a plurality of pairs of first and second side surface terminal electrodes in such a manner that the first and second side surface terminal electrodes are adjacent to each other.

The first and second side surface terminal electrodes are located on each of four side surfaces of the main body of the capacitor. In this case, the first side surface terminal electrodes and the second side surface terminal electrodes are adjacent to each other via the four side surfaces of the main body. This arrangement is effective for achieving further reduction of ESL.

The first and second side surface terminal electrodes are arranged to extend in the direction in which the first and second main surface terminal electrodes are arranged, and the second side surface terminal electrodes are adjacent to the first main surface terminal electrodes. In addition, the first side surface terminal electrodes are adjacent to the second main surface terminal electrodes.

Also, the first and second conductive via-holes include conductive via-holes positioned in the peripheries of the first and second low ESL internal electrodes.

Further, the multilayer capacitor of various preferred embodiments of the present invention further includes a third leading electrode electrically connecting a first low ESL internal electrode to a first side surface terminal electrode and a fourth leading electrode electrically connecting a second low ESL internal electrode to a second side surface terminal electrode.

Furthermore, preferred embodiments of the present invention greatly increase a current capacitance of the multilayer capacitor.

A first low ESL internal electrode and a first high capacitance internal electrode are electrically connected to the same first side surface terminal electrode. A second low ESL internal electrode and a second high capacitance internal electrode are electrically connected to the same second side surface terminal electrode. In this situation, the total cross-sectional area of the first and second side surface terminal electrodes is preferably larger than that of the first and second conductive via-holes. When the total cross-sectional area thereof is increased in such a manner that the total cross-sectional area is substantially equal to or greater than approximately $5.0 \times 10^{-4}$ mm$^2$, or furthermore substantially equal to or more than approximately $1.0 \times 10^{-2}$ mm$^2$, the current capacitance is greatly increased.

When the multilayer capacitor includes a third conductive via-hole electrically connecting at least one of the first and second low ESL internal electrodes to at least one of the first and second high capacitance internal electrodes, the cross-sectional area of the third conductive via-hole is preferably larger than those of the first and second conductive via-holes. In this case, similarly, as the total cross-sectional area of the third conductive via-hole is even more increased, for example, in such a manner that the total cross-sectional area thereof is substantially equal to or greater than approximately $5.0 \times 10^{-4}$ mm$^2$, and furthermore, set to be equal to or greater than approximately $1.0 \times 10^{-2}$ mm$^2$, the current capacitance is greatly increased.

In preferred embodiments of the present invention, when the first and second side surface terminal electrodes have portions extending to at least one of the first and second main surfaces of the main body of the multilayer capacitor, all of the electrical connections between the first and second main surface terminal electrodes and the first and second side surface terminal electrodes included in the multilayer capacitor can be arranged on the main surfaces of the main body. As a result, wiring is greatly simplified.

Furthermore, when the first and second side surface terminal electrodes have portions extending to the first main surface of the main body, all of the electrical connections between the first and second main surface terminal electrodes and the first and second side surface terminal electrodes included in the multilayer capacitor can be arranged only on the first main-surface side of the main body.

In addition, when the first and second side surface terminal electrodes have portions extending to both of the first and second main surfaces of the main body, besides the above-mentioned advantages, there is another advantage, in which the first and second side surface terminal electrodes can be used as current paths with high reliability.

When each of the first and second main surface terminal electrodes has a height that is substantially equal to or greater than approximately $1.0 \times 10^{-2}$ mm on the first main surface of the main body, and each of the first and second side surface terminal electrodes has a height that is substantially equal to or greater than approximately $1.0 \times 10^{-2}$ mm on the first and/or second main surface of the main body thereof, the process in which the main surface terminal electrodes and the side surface terminal electrodes are exposed by grinding can be applied without fail in the case of manufacturing of a wiring board containing the multilayer capacitor.

In addition, when a MPU chip is mounted on the wiring board incorporating the multilayer capacitor in accordance with various preferred embodiments of the present invention and the multilayer capacitor is arranged in such a manner that the first main surface of the main body of the capacitor faces toward the MPU chip, a route connecting the MPU chip and the multilayer capacitor can be made shorter.

While preferred embodiments have been described above, it is to be understood that modifications and changes will be apparent to those skilled in the art without departing from the spirit of the invention. The scope of the present invention is therefore to be determined solely by the appended claims.

For example, in various preferred embodiments of the present invention, the multilayer capacitor described herein could be a ceramic capacitor, an aluminum oxide capacitor, or a capacitor made with virtually any other technology, as would be obvious to one of skill in the art based on the description herein. In one preferred embodiment, the capacitor is a discrete device, which can be electrically connected to an integrated circuit, to the die side or land side of an electronic circuit package, or to an interposer, socket or printed circuit (PC) board. As a discrete device, the multilayer capacitor also could be embedded within a package, interposer, socket or PC board. These and other modifications and changes, which would be apparent to those skilled in the art, are intended to be incorporated within the scope of the present invention.

What is claimed is:

1. A multilayer capacitor comprising:
    a main body including a first main surface and a second main surface opposing each other, at least one side surface disposed between the first and second main surfaces, and a plurality of laminated dielectric layers;
    a first main surface terminal electrode and a second main surface terminal electrode disposed on the first main surface of the main body;
    a first side surface terminal electrode and a second side surface terminal electrode disposed on at least the one side surface of the main body;
    a low ESL section and a high capacitance section provided in the main body, the low ESL section being on the first main-surface side, and the high capacitance section being on the second main-surface side;
    a first low ESL internal electrode and a second low ESL internal electrode opposing each other via a specific one of the plurality of dielectric layers;
    a first conductive via-hole electrically connecting the first low ESL internal electrode to the first main surface terminal electrode and a second conductive via-hole electrically connecting the second low ESL internal electrode to the second main surface terminal electrode, the first and second low ESL internal electrodes and the first and second conductive via-holes being located in the low ESL section;
    a first high capacitance internal electrode and a second high capacitance internal electrode opposing each other via a specific one of the plurality of dielectric layers; and
    a first leading electrode electrically connecting the first high capacitance internal electrode to the first side surface terminal electrode and a second leading electrode electrically connecting the second high capacitance internal electrode to the second side surface terminal electrode, the first and second high capacitance internal electrodes and the first and second leading electrodes being located in the high capacitance section.

2. A multilayer capacitor according to claim 1, wherein a plurality of pairs of the first and second main surface terminal electrodes are provided, and the first main surface terminal electrodes and the second main surface terminal electrodes are adjacent to each other.

3. A multilayer capacitor according to claim 1, further comprising a plurality of pairs of the first and second side surface terminal electrodes, wherein the first side surface terminal electrodes and the second side surface terminal electrodes are adjacent to each other.

4. A multilayer capacitor according to claim 1, wherein the main body has four side surfaces and the first and second side surface terminal electrodes are disposed on each of four side surfaces of the main body.

5. A multilayer capacitor according to claim 4, wherein the first and second side surface terminal electrodes are adjacent to each other along the four side surfaces of the main body.

6. A multilayer capacitor according to claim 1, wherein the first and second side surface terminal electrodes are arranged in a direction in which the first and second main surface terminal electrodes are arranged, the first main surface terminal electrodes are adjacent to the second side surface terminal electrodes, and the second main surface terminal electrodes are adjacent to the first side surface terminal electrodes.

7. A multilayer capacitor according to claim 1, wherein the length of the first conductive via-hole differs from the length of the second conductive via-hole.

8. A multilayer capacitor according to claim 1, wherein the first conductive via-hole is located in the periphery of the first low ESL internal electrode and the second conductive via-hole is located in the periphery of the second low ESL internal electrode.

9. A multilayer capacitor according to claim 1, further comprising a third leading electrode electrically connecting the first low ESL internal electrode to the first side surface terminal electrode and a fourth leading electrode electrically connecting the second low ESL internal electrode to the second side surface terminal electrode.

10. A multilayer capacitor according to claim 9, wherein the first low ESL internal electrode and the first high capacitance internal electrode are electrically connected to the same first side surface terminal electrode, and the second low ESL internal electrode and the second high capacitance internal electrode are electrically connected to the same second side surface terminal electrode.

11. A multilayer capacitor according to claim 10, wherein the total cross-sectional area of the first and second side surface terminal electrodes is larger than the total cross-sectional area of the first and second conductive via-holes.

12. A multilayer capacitor according to claim 11, wherein the total cross-sectional area of the first and second side surface terminal electrodes is substantially equal to or greater than approximately $5.0 \times 10^{-4}$ mm$^2$.

13. A multilayer capacitor according to claim 11, wherein the total cross-sectional area of the first and second side surface terminal electrodes is substantially equal to or greater than approximately $1.0 \times 10^{-2}$ mm$^2$.

14. A multilayer capacitor according to claim 1, further comprising a third conductive via-hole electrically connecting at least one of the first low ESL internal electrode and the second low ESL internal electrode to at least one of the first high capacitance internal electrode and the second high capacitance internal electrode.

15. A multilayer capacitor according to claim 1, further comprising:
    a third leading electrode electrically connecting the first low ESL internal electrode to the first side surface terminal electrode and a fourth leading electrode electrically connecting the second low ESL internal electrode to the second side surface terminal electrode; and
    a third conductive via-hole electrically connecting at least one of the first low ESL internal electrode and the second low ESL internal electrode to at least one of the first high capacitance internal electrode and the second high capacitance internal electrode;
    wherein the first low ESL internal electrode and the first high capacitance internal electrode are electrically connected to the same first side surface terminal electrode, and the second low ESL internal electrode and the second high capacitance internal electrode are electrically connected to the same second side surface terminal electrode.

16. A multilayer capacitor according to claim 15, wherein the total cross-sectional area of the first and second side surface terminal electrodes and the third conductive via-hole is substantially equal to or greater than approximately $5.0 \times 10^{-4}$ mm$^2$.

17. A multilayer capacitor according to claim 16, wherein the total cross-sectional area of the first and second side surface terminal electrodes and the third conductive via-hole is substantially equal to or greater than approximately $1.0 \times 10^{-2}$ mm$^2$.

18. A multilayer capacitor according to claim 15, wherein the first and second side surface terminal electrodes have portions extending to at least one of the first main and second main surface of the main body.

19. A multilayer capacitor according to claim 18, wherein the first and second side surface terminal electrodes have portions extending to the first main surface of the main body.

20. A multilayer capacitor according to claim 19, wherein the first and second main surface terminal electrodes and the first and second side surface terminal electrodes have lengths that are substantially equal to or greater than approximately $1.0 \times 10^{-2}$ mm.

21. A multilayer capacitor according to claim 18, wherein the first and second side surface terminal electrodes have portions extending to the first and second main surfaces of the main body.

22. A multilayer capacitor according to claim 21, wherein the first and second main surface terminal electrodes have lengths that are substantially equal to or greater than approximately $1.0 \times 10^{-2}$ mm on the first main surface of the main body, and the first and second side surface terminal electrodes have lengths that are substantially equal to or greater than approximately $1.0 \times 10^{-2}$ mm on the first and second main surfaces of the main body.

23. A multilayer capacitor according to claim 1, wherein the first low ESL internal electrode and the first high capacitance internal electrode have substantially the same outer configuration, and the second low ESL internal electrode and the second high capacitance internal electrode have substantially the same outer configuration.

24. A multilayer capacitor according to one of claim 1, wherein the multilayer capacitor defines a decoupling capacitor connected to a power source circuit for a MPU chip incorporated in a micro-processing unit.

25. A wiring board comprising the multilayer capacitor according to claim 1.

26. A wiring board containing the multilayer capacitor according to claim 1.

27. A wiring board according to claim 25 comprising:
a MPU chip disposed in a micro-processing unit;
a power source conductive wire arranged to supply a power source used for the MPU chip; and
a ground-side conductive wire;
wherein one of the first main surface terminal electrode and the second main surface terminal electrode and one of the first side surface terminal electrode and the second side surface terminal electrode are electrically connected to the power source conductive wire, and the remaining main surface terminal electrode and the remaining side surface terminal electrode are electrically connected to the ground-side conductive wire.

28. A wiring board according to claim 27, wherein the multilayer capacitor such that the first main surface of the main body of the multilayer capacitor faces toward the MPU chip.

29. A decoupling circuit comprising the multilayer capacitor according to claim 1.

30. A high frequency circuit comprising the multilayer capacitor according to claim 1.

31. A multilayer capacitor according to claim 14, wherein the total cross-sectional area of the third conductive via-hole is greater than the total cross-sectional area of the first and second conductive via-holes.

32. A wiring board according to claim 26, comprising:
an MPU chip disposed in a micro-processing unit;
a power source conductive wire arranged to supply a power source used for the MPU chip; and
a ground-side conductive wire; wherein
one of the first main surface terminal electrode and the second main surface terminal electrode and one of the first side surface terminal electrode and the second side surface terminal electrode are electrically connected to the power source conductive wire, and the remaining main surface terminal electrode and the remaining side surface terminal electrode are electrically connected to the ground-side conductive wire.

33. A wiring-board according to claim 32, wherein the multilayer capacitor such is arranged such that the first main surface of the main body of the multilayer capacitor faces toward the MPU chip.

34. A capacitor comprising:
a first tier of capacitance, which includes multiple first layers of patterned conductive material separated by layers of dielectric material;
a first number of first capacitor vias, which extend from a top surface of the capacitor through the multiple first layers, wherein some of the first capacitor vias make electrical contact with every other one of the multiple first layers, and others of the first capacitor vias make electrical contact with a remainder of the multiple first layers;
a second tier of capacitance, electrically connected to the first tier of capacitance, which includes multiple second layers of patterned conductive material;
a second number of second capacitor vias, which extend through the multiple second layers, wherein some of the second capacitor vias make electrical contact with every other one of the multiple second layers, and others of the second capacitor vias make electrical contact with a remainder of the multiple second layers; and
a first side surface terminal electrode and a second side surface terminal electrode disposed on at least one side surface of the capacitor, wherein the first side surface terminal electrode makes electrical contact with some of the multiple first layers and multiple second layers, and the second side surface terminal electrode makes electrical contact with others of the multiple first layers and multiple second layers.

35. The capacitor as claimed in claim 34, wherein the second tier of capacitance is located substantially underneath the first tier of capacitance, and the second capacitor vias extend through the multiple first layers, wherein some of the second capacitor vias make electrical contact with every other one of the multiple first layers, and others of the second capacitor vias make electrical contact with a remainder of the multiple first layers.

36. The capacitor as claimed in claim 35, wherein the first number of first capacitor vias is greater than the second number of second capacitor vias.

37. The capacitor as claimed in claim 35, wherein the second capacitor vias extend to a bottom surface of the capacitor so that electrical connections can be made to the second capacitor vias at the bottom surface.

38. The capacitor as claimed in claim 34, further comprising:
at least one additional tier of capacitance, electrically connected between the first tier of capacitance and the second tier of capacitance, which includes multiple additional layers of patterned conductive material; and
additional capacitor vias, which extend through the multiple additional layers, wherein some of the additional capacitor vias make electrical contact with every other one of the multiple additional layers, and others of the additional capacitor vias make electrical contact with a remainder of the multiple additional layers.

39. The capacitor as claimed in claim 34, further comprising:
at least one additional tier of capacitance, located substantially underneath the first tier of capacitance and the second tier of capacitance, which includes multiple additional layers of patterned conductive material, wherein some of the additional layers of patterned conductive material make electrical contact with the first side surface terminal electrode, and others of the additional layers of patterned conductive material make electrical contact with the second side surface terminal electrode.

40. A method for fabricating a capacitor, the method comprising:
fabricating a multi-layer structure, which includes a first tier of capacitance and a second tier of capacitance electrically connected to the first tier of capacitance, the first tier having multiple first layers of patterned conductive material separated by layers of dielectric material, and the second tier having multiple second layers of patterned conductive material;
forming a first number of first capacitor vias, which extend from a top surface of the capacitor through the multiple first layers, wherein some of the first capacitor vias make electrical contact with every other one of the multiple first layers, and others of the first capacitor vias make electrical contact with a remainder of the multiple first layers; and
forming a first side surface terminal electrode and a second side surface terminal electrode disposed on at least one side surface of the capacitor, wherein the first side surface terminal electrode makes electrical contact with some of the multiple first layers and multiple second layers, and the second side surface terminal electrode makes electrical contact with others of the multiple first layers and multiple second layers.

41. The method as claimed in claim 40, further comprising:
forming a second number of second capacitor vias, which extend through the multiple second layers, wherein some of the second capacitor vias make electrical contact with every other one of the multiple second layers, and others of the second capacitor vias make electrical contact with a remainder of the multiple second layers.

42. The method as claimed in claim 41, wherein fabricating the multi-layer structure comprises fabricating the second tier of capacitance substantially underneath the first tier of capacitance, and wherein forming the second number of second capacitor vias comprises forming the second capacitor vias to extend through the multiple first layers, wherein some of the second capacitor vias make electrical contact with every other one of the multiple first layers, and others of the second capacitor vias make electrical contact with a remainder of the multiple first layers.

43. The method as claimed in claim 41, wherein forming the second capacitor vias comprises extending the second capacitor vias to a bottom surface of the capacitor so that electrical connections can be made to the second capacitor vias at the bottom surface.

* * * * *